United States Patent [19]

Leung et al.

[11] Patent Number: 5,498,990
[45] Date of Patent: Mar. 12, 1996

[54] REDUCED CMOS-SWING CLAMPING CIRCUIT FOR BUS LINES

[75] Inventors: Wingyu Leung, Cupertino; Winston Lee, San Francisco; Fu-Chieh Hsu, Saratoga, all of Calif.

[73] Assignee: Monolithic System Technology, Inc., San Jose, Calif.

[21] Appl. No.: 417,511

[22] Filed: Apr. 5, 1995

Related U.S. Application Data

[63] Continuation of Ser. No. 156,186, Nov. 22, 1993, abandoned, which is a continuation-in-part of Ser. No. 927,564, Aug. 10, 1992, abandoned, which is a continuation-in-part of Ser. No. 865,410, Apr. 8, 1992, abandoned, which is a continuation-in-part of Ser. No. 787,984, Nov. 5, 1991, abandoned.

[51] Int. Cl.$^6$ .................................................. H03K 5/08
[52] U.S. Cl. ................... 327/323; 365/189.06; 327/309; 327/319
[58] Field of Search ................................. 327/202, 203, 327/309, 312–324, 327, 328, 332, 363; 365/189.06, 189.05, 230.05

[56] References Cited

U.S. PATENT DOCUMENTS

| | | |
|---|---|---|
| 3,585,378 | 5/1969 | Bouricius et al. |
| 3,651,473 | 3/1972 | Faber |
| 3,761,879 | 9/1973 | Brandsma et al. |
| 3,803,562 | 4/1974 | Hunter |
| 3,849,872 | 11/1974 | Hubacher .................................. 29/574 |
| 3,983,537 | 9/1976 | Parsons et al. |
| 4,007,452 | 2/1977 | Hoff, Jr. .................................. 340/173 |
| 4,038,648 | 7/1977 | Chesley |

(List continued on next page.)

FOREIGN PATENT DOCUMENTS

| | | |
|---|---|---|
| 0178949 | 4/1986 | European Pat. Off. |
| 0389203 | 9/1990 | European Pat. Off. |
| 59-212962 | 12/1984 | Japan |
| WO-16680 | 10/1991 | WIPO |
| WO93/18463 | 9/1993 | WIPO |
| WO93/18462 | 9/1993 | WIPO |
| WO93/18459 | 9/1993 | WIPO |

OTHER PUBLICATIONS

Peter van Zant, *Microchip, A Practical Guide to Semiconductor Processing*, 1st Ed., Semiconductor Services, San Jose, CA 1986, p. 8.

MacDonald et al, "Dynamic RAMs 200mb Wafer Memory," IEEE ISSCC, Feb. 17, 1989, pp. 240–241 and 350.

Cavil et al., "Wafer–Scale Integration," Microelectronics Manufacturing Technology, May, 1991, pp. 55–59.

Herbert Stopper, "Wafer–Scale Integration," Hybrids and High–Level Integration, pp. 354–364.

Ron Iscoff, "Characterizing Quickturn ASICs: It's Done with Mirrors" semiconductor International, Aug. 1, 1990, pp. 68–73.

(List continued on next page.)

*Primary Examiner*—Toan Tran
*Attorney, Agent, or Firm*—Skjerven, Morrill, MacPherson Franklin & Friel; Norman R. Klivans; E. Eric Hoffman

[57] ABSTRACT

A memory system having several memory devices coupled to a memory controller through an I/O bus, each memory device including multiple memory modules coupled to a chip I/O interface through an internal bus. The system includes a circuit for driving the I/O bus with a reduced CMOS-swing, a circuit for driving the internal bus with a full CMOS-swing in one bus direction and with a reduced CMOS-swing in the other bus direction, a column address generation circuit for allowing sequentially addressed data to be accessed with the decoder delay being eliminated, and a circuit for re-synchronizing data from a source clock to a destination clock with reduced access latency penalty. Simultaneously writing data into multiple circuit modules significantly increases the write bandwidth of the memory. Also included are a dynamic base-address mapping into an address space, a read or write operation across multiple memory modules, a novel I/O bus format, and a protocol and test mode for testing redundant memory sub-arrays.

21 Claims, 15 Drawing Sheets

U.S. PATENT DOCUMENTS

| | | | |
|---|---|---|---|
| 4,063,225 | 12/1977 | Stewart | 365/188 |
| 4,071,887 | 1/1978 | Daly et al. . | |
| 4,092,733 | 5/1978 | Coontz et al. . | |
| 4,188,670 | 2/1980 | Hsia | 365/49 |
| 4,227,045 | 10/1980 | Chelcun et al. . | |
| 4,319,356 | 3/1982 | Kocol et al. . | |
| 4,329,685 | 5/1982 | Mahon et al. . | |
| 4,379,327 | 4/1983 | Tietjen et al. . | |
| 4,407,014 | 9/1983 | Holtey et al. . | |
| 4,458,297 | 7/1984 | Stopper et al. | 361/403 |
| 4,467,400 | 8/1984 | Stopper | 361/403 |
| 4,494,196 | 1/1985 | Greer . | |
| 4,605,928 | 8/1986 | Georgiou . | |
| 4,615,017 | 9/1986 | Finlay et al. . | |
| 4,627,058 | 12/1986 | Moriyama . | |
| 4,630,355 | 12/1986 | Johnson | 29/575 |
| 4,639,861 | 1/1987 | Appiano et al. . | |
| 4,646,298 | 2/1987 | Laws et al. . | |
| 4,653,050 | 3/1987 | Vaillancourt . | |
| 4,663,758 | 5/1987 | Lambarelli et al. . | |
| 4,667,328 | 5/1987 | Imran . | |
| 4,703,436 | 10/1987 | Varshney . | |
| 4,707,808 | 11/1987 | Heimbigner | 365/182 |
| 4,719,621 | 1/1988 | May . | |
| 4,847,615 | 7/1989 | McDonald . | |
| 4,866,508 | 9/1989 | Eichelberger et al. | 357/74 |
| 4,872,137 | 10/1989 | Jennings, III . | |
| 4,881,232 | 11/1989 | Sako et al. . | |
| 4,906,987 | 3/1990 | Venaleck et al. | 340/825 |
| 4,926,382 | 5/1990 | Sakui et al. . | |
| 4,943,914 | 7/1990 | Kubo . | |
| 4,943,966 | 7/1990 | Giunta et al. . | |
| 4,955,020 | 9/1990 | Stone et al. . | |
| 4,970,724 | 11/1990 | Yung . | |
| 4,974,048 | 11/1990 | Chakravorty et al. | 357/40 |
| 4,980,765 | 12/1990 | Kudo et al. | 358/160 |
| 4,984,192 | 1/1991 | Flynn . | |
| 4,985,895 | 1/1991 | Pelkey . | |
| 5,020,020 | 5/1991 | Pomfret et al. | 364/900 |
| 5,043,820 | 8/1991 | Wyles et al. . | |
| 5,045,725 | 9/1991 | Sasaki et al. | 307/465 |
| 5,055,897 | 10/1991 | Canepa et al. | 357/23.5 |
| 5,077,596 | 12/1991 | Inoue | 357/41 |
| 5,077,737 | 12/1991 | Leger et al. . | |
| 5,077,738 | 12/1991 | Larsen et al. . | |
| 5,103,424 | 4/1992 | Wade . | |
| 5,111,271 | 5/1992 | Hatada et al. | 357/45 |
| 5,111,434 | 5/1992 | Cho . | |
| 5,128,737 | 7/1992 | van der Have | 357/40 |
| 5,133,064 | 7/1992 | Hotta et al. . | |
| 5,159,273 | 10/1992 | Wright et al. . | |
| 5,187,779 | 2/1993 | Jeddeloh et al. . | |
| 5,204,836 | 4/1993 | Reed . | |
| 5,214,657 | 5/1993 | Farnworth et al. . | |
| 5,218,686 | 6/1993 | Thayer . | |
| 5,243,703 | 9/1993 | Farmwald et al. | 395/325 |
| 5,252,507 | 10/1993 | Hively et al. . | |
| 5,254,883 | 10/1993 | Horowitz et al. | 307/443 |
| 5,261,077 | 11/1993 | Duval et al. . | |
| 5,268,639 | 12/1993 | Gasbarro et al. | 324/158 |
| 5,329,174 | 7/1994 | Chiang . | |

OTHER PUBLICATIONS

Takai et al., "250 Mbyte/s Synchronous DRAM Using a 3–Stage–Pipelined Architecture," IEEE Jnl of Solid State circuirts, vol. 29, No. 4, Apr. 1994, pp. 426–431.

Fujii, et al., "A 50–µA Standby 1Mx1/256Kx4 CMOS DRAM with High–Speed Sense Amplifier," IEEE Jnl of Solid State Circuits, vol. SC–21, No. 5, Oct. 1986, pp. 643–647.

"32K x 9 Bit BurstRAM™ Synchronous Static RAM with burst Counter and Self–timed Write," *Motorola Memory Data*, pp. 7–100 to 7–109.

"A Design and Yield Evaluation Technique for Wafer–Scale Memory", Apr. 1992, Yamashita et al., Fujitsu.

"Task–Flow Architecture for WSI Parallel Processing", Apr. 1992, Robert W. Horst, Tandem Computers, Inc.

"A Monolithic Hough Transform Processor Based on Restructurable VLSI", Rhodes et al., Jan. 1988.

"Yield Optimization in Large RAM's with Hierarchical Redundancy", Ganapathy et al., Sep. 1991.

"Wafer–Scale Integration—A Fault–Tolerant Procedure", Aubusson et al., Jun. 1978.

"Designing With the IDT49C460 and IDT 39C60 Error Detection and Correction Unite", Stodieck, Jan. 1989.

"Reconfiguration of Binary Trees: The Flow–Driven Approach", Antola et al., 1991.

"Large Area Defect–Tolerant Tree Architectures", Shi et al., 1991.

REDUCED CMOS-SWING CLAMPING CIRCUIT FOR BUS LINES

CROSS-REFERENCE TO RELATED APPLICATIONS

This application is a continuation of U.S. patent application Ser. No. 08/156,186, filed Nov. 22, 1993, now abandoned, which in turn is a continuation-in-part of U.S. patent application Ser. No. 07/927,564 filed Aug. 10, 1992, entitled "Fault-tolerant, High Speed Bus System and Bus Interface for Wafer Scale Integration", now abandoned, which, in turn is a continuation-in-part of U.S. patent application Ser. No. 07/865,410 filed Apr. 8, 1992 entitled "Circuit Module Redundancy Architecture", now abandoned, which, in turn is a continuation-in-part of U.S. patent application Ser. No. 07/787,984 filed Nov. 5, 1991 entitled "Wafer-scale Integration Architecture, Circuit, Testing and Configuration", now abandoned.

BACKGROUND OF THE INVENTION

1. Field of the Invention

This invention relates to a low latency, high bandwidth bus system for use in a high-performance, large capacity memory system, logic system or combined logic and memory system, and particularly to such a bus system suitable for conventional VLSI devices or wafer-scale integration devices with a circuit module-oriented architecture.

2. Description of the Prior Art

Many traditional bus systems use reduced-swing signal transmission (i.e., a signal swing smaller than the supply voltage), including TTL standard, to enable high speed operations. Problems usually arise in data transmission when either of the following conditions exists: (i) the rise or fall time of the transmitted signal is a significant fraction of the clock period; (ii) there are reflections on the signal bus which interfere with the rising or falling transitions of the signal. The data transfer rate is limited in part by whether signal integrity is compromised as a result of the above conditions. The other hindrance is the maximum cycle rate of the memory and controller. To increase data bandwidth, the above conditions should be avoided.

High frequency data transmission through a bus requires a high rate of electrical charge (Q) transfer on and off the bus to achieve adequate rise and fall times. To avoid condition (i) above, large transistors in the memory and controller are needed to source and sink large amounts of current required to switch the signal levels. This requirement undesirably causes increased silicon area, bus capacitance, power consumption and power supply noise.

Assuming transmission rate is a constant, there are several known ways to improve the situation. One is to minimize the bus capacitance, but this severely constrains the bus length as well as the number of devices that can be attached to the bus. The second method is to reduce the voltage swing needed to distinguish between logical 1 and 0. This reduces the amount of charge transfer; thereby, power consumption, noise and silicon area can be reduced. To minimize condition (ii), impedance matching using proper line termination can be used to reduce reflection. The reference voltage, or trip point, of a signal bus is the voltage level which delineates a logical 1 from a logical 0. Most digital CMOS circuits use supply voltage Vdd/2 as the trip point, and this permits the circuits to operate with symmetric noise margins with respect to the power and ground supply voltages. This also results in symmetrical inverter output rise and fall times because the PMOS and NMOS transistors in the circuit have equal strengths due to the fact that Vdd/2 is the trip point. With the exception of center-tap termination (CTT), prior art small swing (<1.5 v peak-to-peak) I/O schemes generally have symmetric voltage swings about a reference voltage that has no intended relation to the "natural" implicit reference voltage (Vdd/2) about which typical digital CMOS circuit operates. Examples of these schemes are the Gunning-Transceiver Logic (GTL) (R. Foss et al, IEEE Spectrum Oct. 1992, p. 54–57, "Fast Interfaces for DRAMs"), Rambus DRAM (M. Farmwald et al, IEEE Spectrum Oct. 1992, p. 50–51 "A Fast Path to One Memory"; and R. Comeford et al, "Memory Catches Up", p. 34–35, same issue). These require an explicit voltage reference source, either internal or external to the chip. In order to attain the desired attributes of symmetric noise margins and rise and fall time, these schemes must translate their small swing I/O reference point to the "natural" reference. This translation incurs the penalty of additional circuit delay and complexity. Furthermore, each bus line is terminated to the reference supply through a resistor with a value matching bus line impedance.

Center-tap termination, (R. Foss et al, IEEE Spectrum Oct. 1992, p. 54–57, "Fast interfaces for DRAMs") differs in that this scheme can accommodate Vdd/2 as the I/O reference without the need for an external reference supply voltage. Bus line resistive termination to Vdd/2 can be attained through a resistive voltage divider coupled between Vdd and ground. Small swing signal is attained through a feedback mechanism which reduces the drive of the output driver once the output voltage crosses the termination reference voltage (Vdd/2).

There are several drawbacks to this scheme. First, the logic required to perform the feedback mechanism is directly in the data path. This means added data-out delay or latency. Also the transistor count and static DC power required to implement this feedback control logic, which includes a threshold detector, may become a burden. Finally, this scheme requires two termination resistors per bus line. If a relatively wide bus were to be employed, this results in high component count and increase in required board space.

SUMMARY OF THE INVENTION

In accordance with the present invention, a compact, high speed reduced CMOS swing I/O scheme uses the natural CMOS inverter trip point as its reference voltage, without an external reference voltage supply. Furthermore, the standby current present in prior art reduced-swing schemes can be eliminated during the standby mode when no data is transmitting in the present invention.

Prior art bus architectures, whether in ICs or in system boards, make no distinction, relative to signal swing amplitude, with respect to direction of signal travel across the bus. The signal swing amplitude transmitted from one end of the bus is identical to transmissions sent from the other direction. In accordance with the present invention, an asymmetrical signal-swing internal bus optimizes the speed, area and power of the bus system with few masters and many slave devices.

For high-speed burst mode operation, the prior art method to sequence the column select lines is to load the starting address into a counter controlled by the memory clock and connect the counter output to a decoder. The output of this decoder is buffered to drive the column select lines. At every rising clock edge the counter increments and its output decoded to generate the next active column select line. The column select lines are asserted in consecutive order for the duration of one clock cycle. The drawback to this approach is that the clock to valid column-select delay time is the sum of the clock to out time of the counter, the propagation delays of the decoder and the buffer. This delay directly affects the burst frequency and therefore the access bandwidth. In addition, since the decoder typically is implemented with combinational logic, the propagation delay through the decoder is not uniform for each input transition. As a result, simultaneous assertion of one or more column selects may occur for the duration of the decoder delay mismatches causing memory read or write failures. The present invention allows decoding of the address input first, followed by a barrel shifter circuit before driving the column select lines to eliminate the above mentioned shortcomings.

Prior art memory designs attempt to increase bandwidth by implementing synchronous burst transfers. Latency for the first accessed data is increased due to the insertion of a pipeline to increase the data rate. In these designs incorporating synchronous burst transfer mode, access latency is quantized and measured in clock cycles as opposed to traditional non-synchronous memory where access latency is measured in time units. (E.g., see data sheet from Samsung Electronics, "256K×4 units and bit Synchronous SRAM", and Motorola Semiconductor "32K×9 bit BurstRAM-Synchronous SRAM) The access latency (the time from the clock transition which latches the read command to the time when data is valid to the requestor) can only be resolved after one clock period regardless of the frequency of the clock. In accordance with the present invention, this shortcoming is reduced by using a resynchronization FIFO/buffer triggered by both the source clock and the destination clock signals.

Traditional memory devices are usually arranged in an x–y array with each of the dimensions being an integer power of 2. This arrangement does not, in general, fit with typical computer display resolutions (such as 640×480, 1024×768, 1280×1024, etc.) and, as a result wastes large number of memory bits that cannot be displayed. Many approaches have been proposed in the prior art to solve this problem, all of them in effect some kind of remapping of the display to fit into the memory device. This approach (for example, Y. Kudo et al, "Frame Buffer Memory for Display", U.S. Pat. No. 4,980,765), however, involves complicated calculation of pixel data movement during each display screen refresh and screen pixel update, and significantly reduces the performance of the display system. In accordance with the present invention, with circuit-module oriented architecture, a memory device (such as DRAM) is partitioned into many small blocks each with its own independent addressing means and dynamic address mapping capability, and thereby allows remapping the memory to fit the pixel arrangement of the display with minimum memory bits used.

Prior art multiple-write operations such as the "blockwrite" operation in dual-port DRAM allow simultaneous data written into multiple column locations (the sense amplifiers) from a pre-loaded color register. (e.g., see the data sheet for "1M bit dual-port DRAM", Mitsubishi Electric.) This arrangement allows multiple horizontal pixels in a display memory to be written with the same pixel data only. However, it cannot be used when varying data need to be written, or when multiple vertical pixels need to written with the same data such as during a pattern fill operation of the display memory. One disclosure uses multiple memory devices operated in an interleaved mode to improve this situation (e.g., G. Moffat, "Method and Apparatus for Arranging Access of VRAM to Provide Accelerated Writing of Vertical Lines to an Output Display", U.S. Pat No. 5,142,276). The present invention allows a broadcast-write operation that allows burst data stream to be written into selective, multiple memory circuit modules (that can be mapped into different vertical lines in a display memory) simultaneously and thereby dramatically increase write data bandwidth.

Existing memory, when burst mode is implemented, can only burst data out from the column circuitry (so called "page" mode, and is typically mapped into the horizontal direction in a display memory; see the above referenced Mitsubishi data sheet for dual-port DRAM). Any vertical pixel movement requires the memory to exit page mode, load another row of data and then access the next pixel data in the then current "page". This access is much slower than the horizontal access. One approach to solve the problem is to implement a special vector addressing scheme-horizontal vector and vertical vector, of the memory page or column circuitry (R. E. Harlin et al, "Dynamic Video RAM Incorporating On Chip Line Modification", U.S. Pat. No. 5,148,523). This approach, however, requires individual (or a few) bit-planes to be updated sequentially, i.e. relatively slow, and the dual-address decoding circuitry is complicated and area consuming. In accordance with the present invention, with its multiple block architecture, both "horizontal" burst (from the column circuitry of each block) and a inter-block burst mode (from consecutive, participating blocks in sequence) read/write operation are provided that can be mapped into the "vertical" pixel direction, therefore allowing high speed access of pixel data in both display directions.

In accordance with the present invention, a reduced CMOS-swing bus circuit includes clamping circuitry for each bus line. The clamping circuitry includes a feedback circuit sensing a signal on the bus line for generating a feedback signal, and a complementary source follower responsive to the feedback signal for clamping the signal on the bus line to provide the reduced CMOS-swing. The feedback circuit is a CMOS inverter and can be disabled to fix the signal on the bus line to a reference level when the bus line is inactive in a preferred embodiment.

A bus circuit for generating directional asymmetrical signal swing on a bus includes a first bus driver circuitry for generating a first signal swing for data transfer over said bus along a first bus direction, and a second bus driver circuitry for generating a second signal swing for data transfer over the bus along a second bus direction. The first signal swing is a full CMOS-swing and the second signal swing is a reduced swing substantially smaller than the first signal swing.

An address generation circuit includes an address decoder receiving a starting address of N bits for generating an address select signal on its $2^N$ output lines and a barrel shifter clocking in said address select signal for shifting the clocked address select signal in a consecutive order.

A resynchronization circuit for resynchronizing a data signal with a source clock signal to a destination clock signal includes an input gate circuit for gating input data with a source clock signal, a buffer for receiving the gated data from the input gate circuit, and a output gate circuit for gating the data stored in the buffer with a destination clock signal. The buffer is a FIFO memory, and includes input and output select circuit in a preferred embodiment.

In accordance with the present invention, in a circuit system with a plurality of circuit modules and a bus connecting thereto, each circuit module has a unique preset address code, and at least one of circuit modules includes at least one set of software-programmable base address registers for mapping the circuit modules into an address space. The base address register has more address space than the preset address codes. The circuit modules are mapped into non-contiguous address space and the content of the base address register can be modified dynamically in some embodiments.

In accordance with the present invention, a scheme for simultaneously writing a data signal into selected subset blocks of a plurality of circuit blocks includes the steps of providing each circuit block with a broadcast-write mode register, issuing a broadcast-write-mode command on the bus for setting the broadcast-write status register in the selected subset of the plurality of circuit blocks, and broadcasting a write command so that circuit blocks with the broadcast-write-mode register set respond to the write command.

A method for inter-block burst operation across multiple circuit block includes providing a mode-bit in each circuit block, setting the mode-bit in circuit blocks participating the burst operation and accessing the participating circuit blocks at each clock cycle in a repeated sequence. The sequence to access the participating circuit blocks corresponds to a preset base address sequence.

Also in accordance with the present invention, a circuit subsystem includes a plurality of circuit blocks and a bus connecting thereto. At least one of the circuit blocks includes a redundant circuit, a test register for enabling testing of the redundant circuit, and a set of repair registers or fuses for setting the redundant circuit into operation. The test register and repair registers are programmable through bus commands.

Also in accordance with the present invention, an I/O bus in a memory subsystem includes multiplexed address and data I/O lines for carrying an address signal, and data signal, command input lines for carrying command signal, dynamic data mask input line for masking a part of the data signal on the bus from a data write operation, and a clock input line for carrying a clock signal. The address signal includes a base address field for addressing a memory module and an access address field for addressing a location or locations in the addressed memory module.

The above and other objects, features and advantages of the present invention will be clear from the following detailed description in conjunction with the accompanying drawings.

DETAILED DESCRIPTION OF THE INVENTION

A high-performance, high-density DRAM device using a circuit module-oriented architecture is described in this disclosure as an example that implements many of the novel features of this invention.

Bus Format and Protocol

Figure 1:
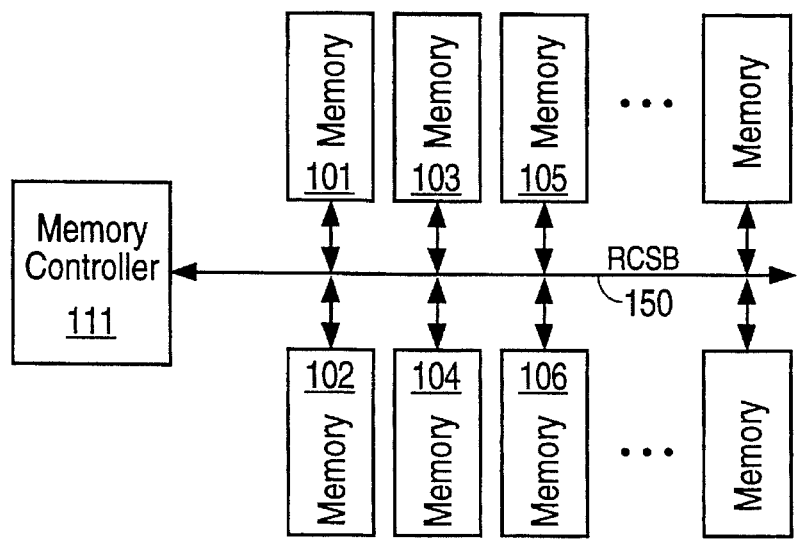
FIG. 1 shows a memory system in accordance with the present invention which is connected to various memory devices through a Reduced-CMOS-Swing Bus (RCSB).

FIG. 1 shows an embodiment of a memory system, in which memory devices (DRAMs) 101, 102 . . . are coupled to one (or more) bus masters (memory controllers) 111 through a reduced-CMOS-swing bus (RCSB) 150 which includes 28 signal lines: four dedicated command lines, sixteen multiplexed data and address lines, four data write mask lines for writing partial data to the memory (for example as shown in Table 1, DQM [0] masks data in D [3:0], DQM [1] masks data in D [7:4], . . . during write operation), one clock line, one chip select line, one output enable line and one clock enable line. Table 1 lists the 28 I/O pin definitions which include signal symbol, name, input/output direction and functional definition of a 1M Byte (8M bit) DRAM memory in one embodiment of the present invention. A typical command requires 20 bits of information: Four bits encode the operation to be performed, and depending on the contents of the four command bits, the remaining sixteen bits can be interpreted as a combination of the following: module address or identification code (ID), row address, column address, command-code extension or configuration data.

TABLE 1

| | Pin definition | | |
|---|---|---|---|
| Signal | Name | I/O | Function |
| D[15:0] | Data/address bus | I/O | Burst transfer data |
| C[3:0] | Command bus | I | Command input |
| DQM[3:0] | Dynamic data mask | I | Dynamic nibble mask |
| Cke | Clock enable | I | Synchronous clock enable |

TABLE 1-continued

| | Pin definition | | |
|---|---|---|---|
| Signal | Name | I/O | Function |
| Clk | Clock | I | Burst transfer timing |
| OE# | Output enable | I | Output enable for burst read |
| CS# | Chip Select | I | Chip Enable |

Each command is issued referenced to a particular transition of the clock, in this case, a low to high transition. Data is grouped as half-words of 16 bits each. Single, consecutive half-words are transmitted at each clock transition, to or from the memory device during a burst write or burst read operation, respectively (this is called dual-edge transfer). Essentially, this allows a 32-bit word to be transmitted every clock cycle using the 16-bit data bus. Conventional data transfers are single edge transfers where a unit of data is transmitted at each rising or falling clock edge, but not at both.

The communication protocol between bus master (controller) and slave (memory) devices minimizes overall data access latency, bus width and operational clock frequency while maximizing data transfer bandwidth. Latency is reduced by simultaneously sending command code and all necessary information, including the full access address over the bus so that the desired command can be executed immediately. A scheme such as one described in Int. Pat No. PCT/US91/02590 [Farmwald et al] has a protocol which requires command and address to be multiplexed and sent at different clock edges; furthermore, because of the use of a narrow bus (8 bits), the address itself has to be segmented and multiplexed at different clock edges. With such a scheme, several clocks must transpire before the entire address is presented to the memory. This translates to latency in addition to the memory's inherent latency. The present system in contrast allows the overall latency to be very close to the inherent latency of the memory, because only one clock transition is needed for the entire address to be presented to the memory device.

Most memory access requests are directed at sequentially addressed memory locations. By taking advantage of this, multiple latency penalties incurred for multiple memory requests are reduced to one latency penalty by requiring only one request for sequential accesses. This is achieved by using a burst operation, which allows sequentially addressed data to be accessed given only the beginning address of a desired data stream. Burst operation eliminates the address generation bottleneck in the controller as well as in the address decoding delay in the memory, particularly in an embodiment with a novel address sequencing circuitry as described below. Burst mode operation also allows address and data to be multiplexed onto a common bus without compromising on data bandwidth. The ability to multiplex address and data significantly reduces the number of lines in the RCSB. This reduces memory pin count, power dissipation, PC board cost and complexity.

A burst read command is generated by establishing, with sufficient setup and hold time with respect to the rising edge of the clock, the burst read command-code on the four bit command bus. The module ID (the circuit block base address or identification code) and the beginning burst address is simultaneously established on the 16 bit multiplexed address/data bus. After some latency, data will stream from the memory module onto the multiplexed address/data bus, with each half-word transmitted at successive transitions of the clock (dual-edge transfer).

Achieving high bandwidth (>500 Mbytes/sec) while maintaining a relatively low operating frequency (>125 MHz) is accomplished by dual-edge transfer burst mode and a 16 bit data path. At this operating frequency, memory design and fabrication can be done with sufficient margin using existing processes. Running a bus at this clock rate on a PC (personal computer) board environment is possible by careful conventional PC board design, and attention to high frequency transmission issues.

Reduced Swing Bus

A compact, high speed Reduced CMOS Swing I/O scheme (RCSB) uses the natural CMOS inverter trip point as its reference voltage without any explicit reference voltage supply. Furthermore, the static DC current present in prior art reduced-swing schemes can be eliminated during the inactive mode in accordance with the present invention.

Figure 2A:
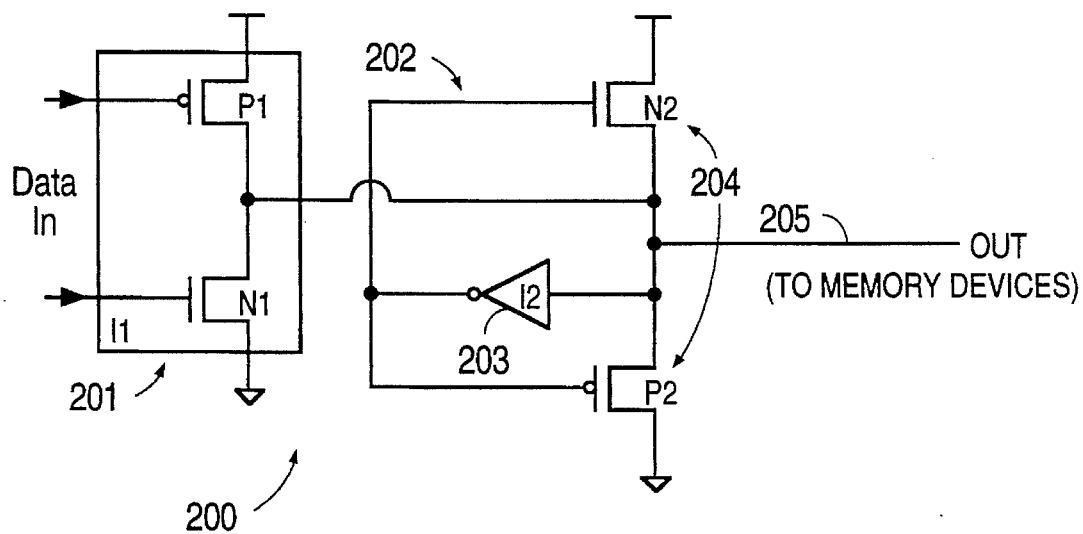
FIG. 2(a) shows a reduced-CMOS-swing line driver with active source-side termination.

This is accomplished by the bus-line driver circuit shown in FIG. 2(a). The bus-line driver circuit 200 includes a line driver 201 which drives the bus line 205, and a feedback clamping circuit 202 which further includes a feedback circuit 203 (an inverter I2 in the illustrated embodiment) and a complementary source follower circuit 204. The bus line 205 is driven by a typical CMOS inverter 201 (I1); however, the line voltage is sensed by inverter 203 (I2) which drives the gate of feedback source follower transistors P2 and N2 with their sources coupled to the bus line 205. When the input of the inverter 201 (I1) is driven low, the line voltage (OUT) will go above the trip point of the inverter 203. As the output of the inverter 201 goes low, transistor N2's conductivity decreases while transistor P2's conductivity increases, thus preventing OUT from going to supply voltage. Conversely, if the input of the inverter 201 is driven high, transistor N2's conductivity increases and transistor P2's conductivity decreases to prevent OUT from reaching ground.

The peak-to-peak voltage swing as well as the common mode voltage generated by the bus line driver can be adjusted by varying the sizes of transistors P2, N2, P1, N1. The receiver for this signal transmission scheme is a conventional CMOS inverter. By using appropriate transistor sizes, the line driver output voltage swing can be centered to that of the receiver trip point.

Figure 2B:
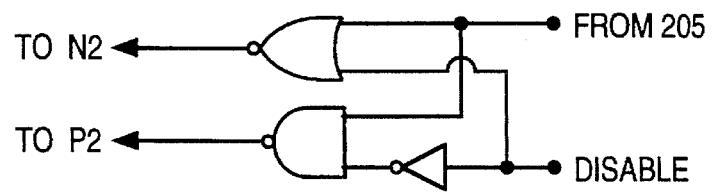
FIG. 2(b) shows a push-pull gate configuration which can replace the feedback inverter of FIG. 2(a).

The feedback inverter 203 (I2) in FIG. 2(a) may also be implemented using NAND gate, NOR gate, push-pull gate or other logic combinations with a control input to disable the feedback path (thereby forcing the inputs of the source follower transistors at either supply level jointly or separately to each supply level) when the bus is inactive to further reduce or eliminate static DC power dissipation. An example of push-pull gate configuration is shown in FIG. 2(b). Also, the feedback clamping circuit 202 can be implemented either in the driver side or the receiver side or both or on a separate chip.

Typical MOS output drivers are not suitable for high frequency transmission because of the excessive reflections caused by gross mismatches between the output impedance of the drivers and the line, or voltage bounces due to large switching transients. By adjusting the device size of the feedback device, the bus-line driver circuit 200 in FIG. 2 can be made suitable for driving typical PC board traces because this driver circuit has a predictable output impedance which is close to that of PC board traces. The inclusion of the feedback devices also serves to stabilize the output impedance of the driver circuit, as the drivers remain in the transistor linear region throughout the signal transition.

With this RCSB scheme, there is no need for internal or external voltage reference sources. Level translating circuits are not required since the reduced swing signal is referenced already to the inverter trip point; hence, translator circuitry and its associated delay is avoided. Furthermore, the inclusion of active bus line termination in the bus line driver circuit eliminates the need for external termination resistors.

DRAM Architecture

Figure 3:
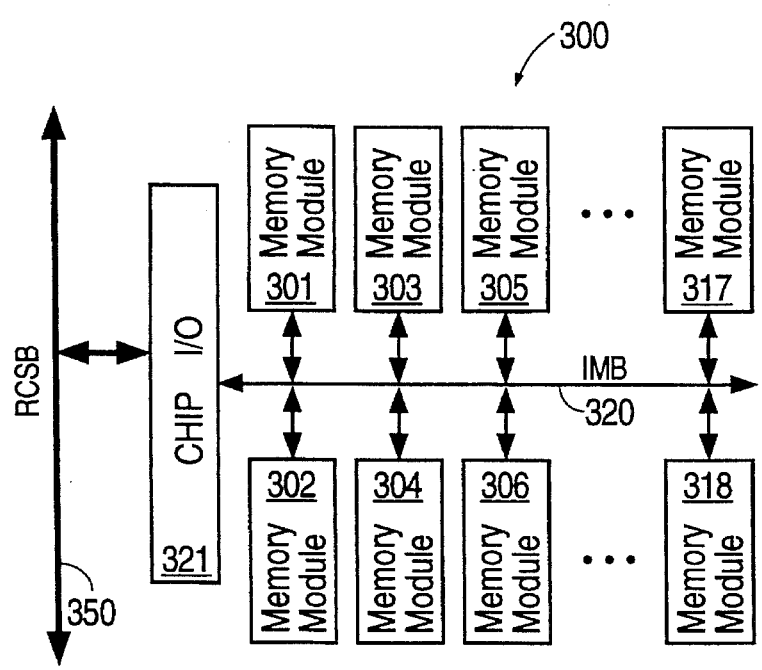
FIG. 3 shows a memory device with its Internal Memory Bus (IMB) connecting the chip I/O area and memory modules.

The DRAM used in the present exemplary embodiment has a capacity of 9.4M bits. The memory is divided into 18 modules of 512K bits each. Sixteen of the memory modules are for regular use and two are spares. FIG. 3 shows a block diagram of the memory modules 301 to 318 connected together by an internal memory bus (IMB) 320. The internal memory bus 320 connects to outside circuitry through the chip interface 321. The chip IO interface 321 connects the memory modules 301 to 318 to the external memory bus 350 described above.

The memory modules 301 to 318 are identically constructed, each with a programmable base address (ID) so that one can replace another. The identification register used to store the module ID acquires its contents from either of two sources—pre-programmed (such as fuse programmed) ID, or controller issued ID. At power-up, each module is assigned a default communication ID previously specified through the use of fuses and/or other pre-programmed code. The memory module ID subsequently can be changed by writing-into the ID register through the use of an ID write command.

Figure 4:
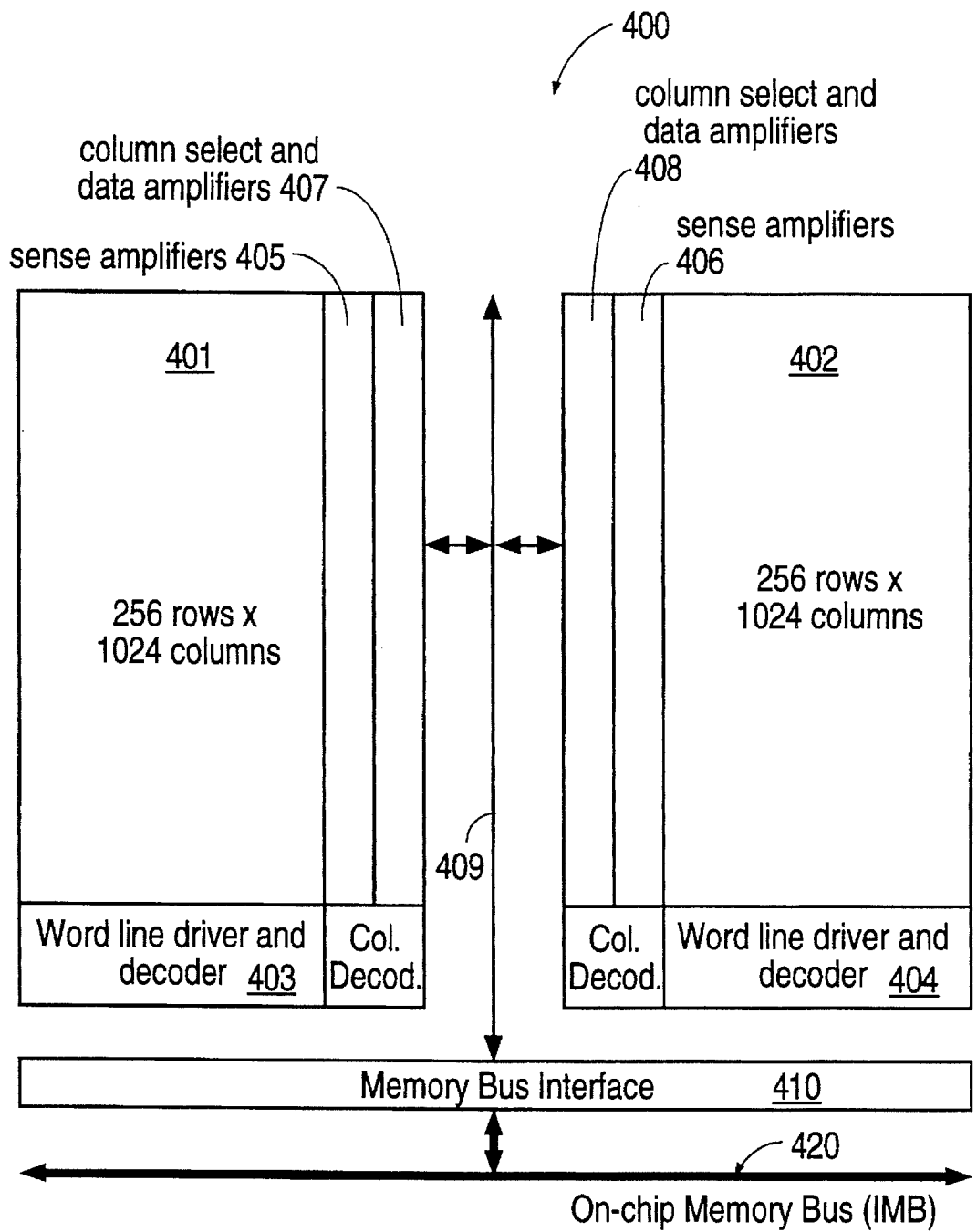
FIG. 4 shows a memory module attached to the IMB through a Memory Bus Interface (MBI).

FIG. 4 shows the organization of a memory module 400 which contains 512K bit of memory divided into two banks 401, 402 each of 256 rows and 1024 columns. Each bank 401, 402 has its own independent row, column and sensing circuitry 405, 406. The latch-type sense amplifiers 405, 406 in each bank form a data buffer of 128 bytes. Read access to the memory is carried out in two steps. First, a row of data (1024 bits) addressed, using the RAS command, is transferred from the memory to corresponding sense amplifiers 405, 406. Next, one or multiple words (32 bits) of data addressed using the burst CAS command is transferred from the sense amplifiers 405, 406 to the internal bus. Thereafter, at each clock cycle the CAS address is incremented and the word associated with this address is transferred from the sense amplifiers to the internal bus. Using dual-edge transfer, a 16-bit bus can transfer a 32-bit word every clock cycle. Sixteen bits can be transferred to or from one of the two banks 401, 402 at the rising edge, and another 16 bits can be transferred to or from the other bank at the falling edge of the clock. Therefore, the column circuitry in each bank operates at the frequency of the memory clock as the bus.

Dynamic Address Mapping

Figure 5A:
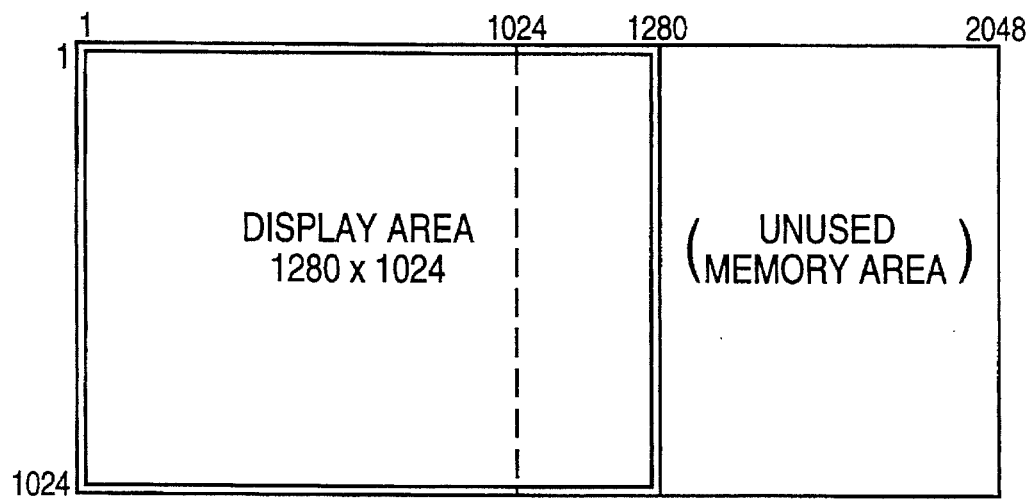
FIGS. 5a and 5b show prior art address mapping for display with (a) 1280×1024, (b) 1024×768 pixels.
Figure 5B:
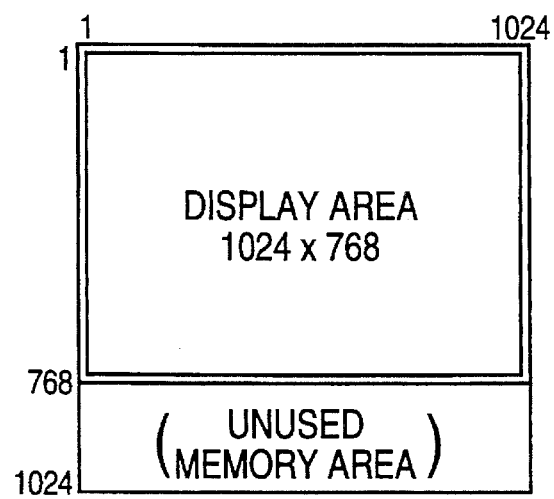
Figure 6A:
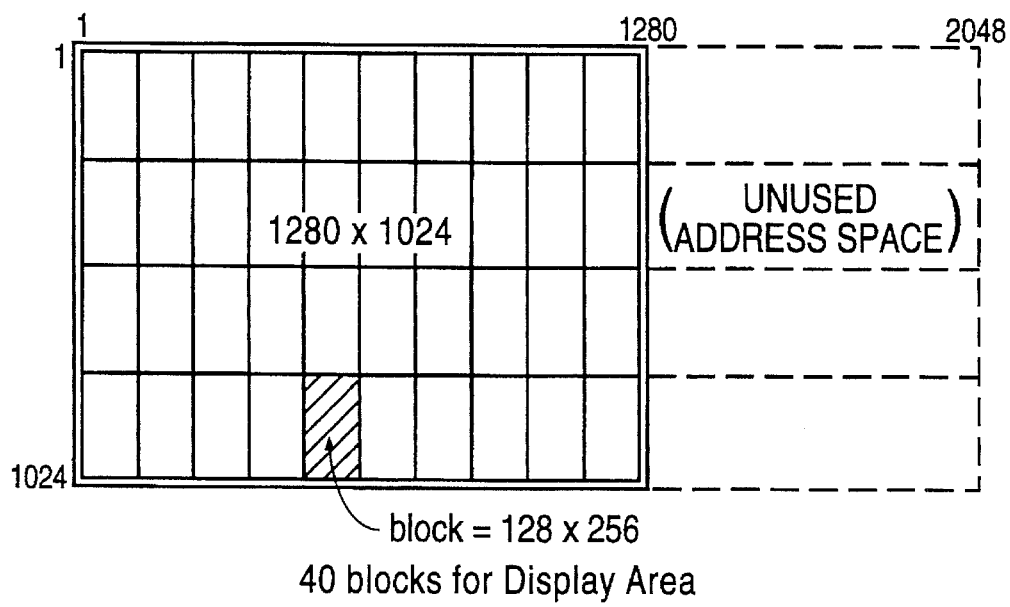
FIGS. 6(a), 6(b) show an example of address mapping for displays with (a) 1280×1024, (b) 1024×768 pixels using block ID address mapping.

The dynamic address mapping (ID mapping) capability of the memory modules and banks (collectively called blocks) in the present memory system with many (32 banks per 1 MByte memory in the present embodiment) blocks, especially when the mappable memory space is larger than the physical memory size, is particularly beneficial in applications such as virtual memory mapping or mapping display memory into direct display pixel organization. The latter provides the benefits of reduced memory bit requirement as well as much faster access and performance since no memory scrambling or re-formatting is required. FIG. 5 shows prior art display pixel mapping into display memory for (a) 1280×1024 pixel resolution and (b) 1024×768 pixel resolution. The former case requires memory size of 2048× 1024 and the latter case requires 1024×1024 (assuming each pixel requires 1 byte of memory), both much bigger than the screen display size. In the present invention, as shown in FIGS. 6(a) and (b) as examples, the individual blocks can be mapped into non-contiguous address space but covering the entire display area with a much smaller number of bits required: 1280×1024 for FIG. 6(a), and 1024×768 for FIG. 6(b).

For example, for a 6 bit ID register (addresses up to 64 blocks from 0 to 63) configuration, the mapping in FIG. 6(a) can be set up as follows:

horizontally: 0, 1, 2, 3, 4, 5, 6, 7, 8, 9, then skipping 10 to 15

16, 17, 18, 19, 20, 21, 22, 23, 24, 25, then skipping 26 to 31

32, 33, 34, 35, 36, 37, 38, 39, 40, 41, then skipping 42 to 47

48, 49, 50, 51, 52, 53, 54, 55, 56, 57 then skipping 58 to 63.

Figure 6B:
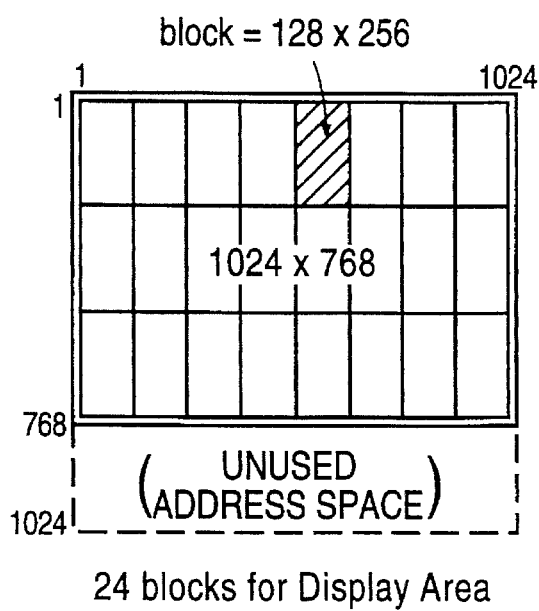

Another example for the mapping in FIG. 6(b) only uses a 5 bit ID register:

horizontally: 0 to 7, 8 to 15, 16 to 23 then skipping 24 to 31.

Internal Bus Architecture

The memory module uses the internal memory bus (IMB) to communicate between the module bus interface (MBI) and the chip I/O. Sixteen multiplex address/data lines, four data write mask lines, four command lines, two clock lines (one from the chip I/O and one from the selected memory module in a source-synchronous fashion) and one output enable line comprise the IMB. The IMB employs a unique signaling architecture designated here Directionally Asymmetric Signal Swing (DASS), which minimizes bus line driver size and noise associated with driving large capacitive loads.

Existing bus architectures, whether in ICs or in system boards, make no distinction, relative to signal swing amplitude, with respect to direction of signal travel across the bus. The signal swing amplitude transmitted from one end of the bus is identical to that sent from the other direction. In the cases where there are many slave devices and one or few masters communicating through a large swing bus, the bus line drivers of both the slaves and the master must be large enough to drive the bus line at the operating frequency. (In this implementation, the slave devices are the memory modules, and the master is the chip I/O.) Large drivers in the memory modules consume more silicon area as well as increase bus line capacitance; furthermore, as the number of memory modules attached to the bus increases, bus capacitance increases. Eventually, increases in driver size does not result in increase of driving speed; consequently, the number of modules on the bus is severely limited. For example, in order to operate at 125 MHz only 6 to 8 modules can be attached to the 5 volt swing bus using a 1μ CMOS process. Large drivers needed to switch heavily loaded lines also significantly increase noise in the chip. Small swing buses, on the other hand, can be used to reduce power supply noise and the size of the bus line drivers, but small swing signal translators or amplifiers for each signal of the bus must be present in every memory module. In an implementation where many memory modules are placed in one die, this results in significant consumption of silicon area and power dissipation.

The DASS architecture in accordance with the present invention capitalizes on the benefits of using both large and small signal swings on the same bus. This architecture takes advantage of the asymmetry of communication in a master-slave communication environment where communication from master to slave is one-to-many (broadcast), but communication from slave to master is one-to-one. Large signal swing is used in the point-to-multiple destinations mode, when master is driving the bus, while small swing is used in the point-to-point mode when one of many memory devices drives the bus.

Executing a unique broadcast-write mode in the present implementation is a good example of a broadcast operation. In the broadcast-write operation, multiple memory banks can be written simultaneously with the same data. Data can be written simultaneously to any particular group of banks or to all banks. This is accomplished by first using a special command called "Broadcast-Write Select" which selects or deselects one or more memory module for participating in the subsequence write operation by setting (select) or resetting (deselect) a group of or all banks a broadcast-write status registers associated with banks in the memory chip. The broadcast-write select command takes one clock cycle. Once a bank is selected for broadcast write, it stays selected and participates in all subsequent write operation until it is deselected by the broadcast write select command. Next, a normal write command is broadcasted with all its write data following. All banks with their broadcast-write status register set will respond to the write command.

Figure 7:
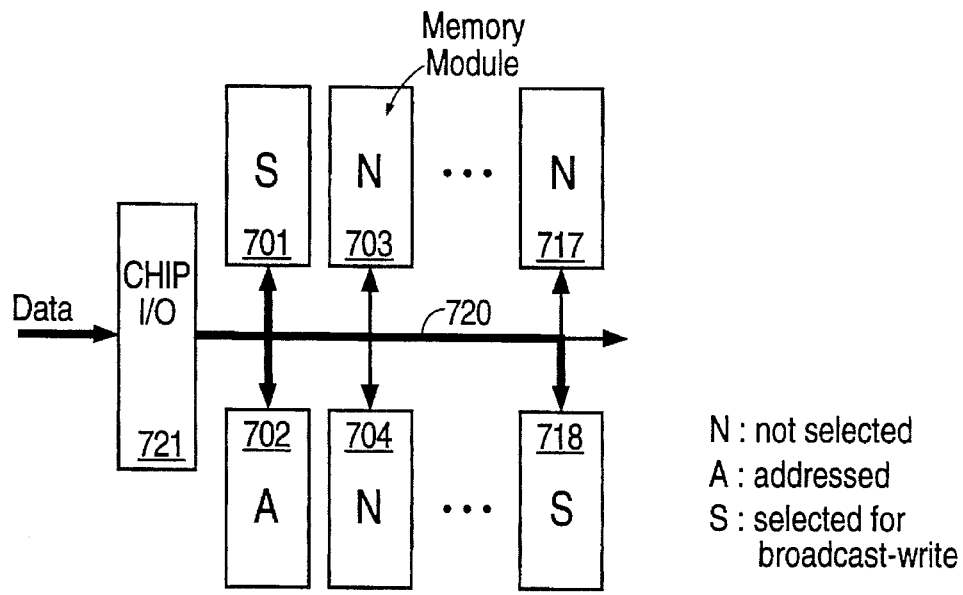
FIG. 7 shows a broadcast-write operation.

For example, in one embodiment, a broadcast-write select command can be used to select up to 4 memory banks. Eight broadcast-write commands back-to-back can be used to select 32 memory banks in the device. Then a normal memory write command can be executed to write a burst of data to all the selected banks simultaneously. In this example, eight cycles are used for the eight broadcast write commands and depends on the burst length of the write data; 2 to 33 cycles are used for writing the data and an additional cycle is required to terminate the burst write. FIG. 7 shows an example of a broadcast-write operation in the memory device.

Memory modules 701, 718 are selected for broadcast-write. Thus the broadcast-write status registers in the modules 701, 718 are set by the command. Memory module 702 is addressed by the address associated with the write command and data is therefore simultaneously written into the selected modules 701, 718 and the addressed module 702. The broadcast-write operation significantly increases the write bandwidth of the memory. Furthermore, in the display memory application where the memory banks or modules (collectively called blocks) can be mapped into different horizontal display lines, a properly set-up broadcast-write can burst-write multiple horizontal lines simultaneously without the need to go through consecutive "page breaks" as in prior art memories.

Figure 8:
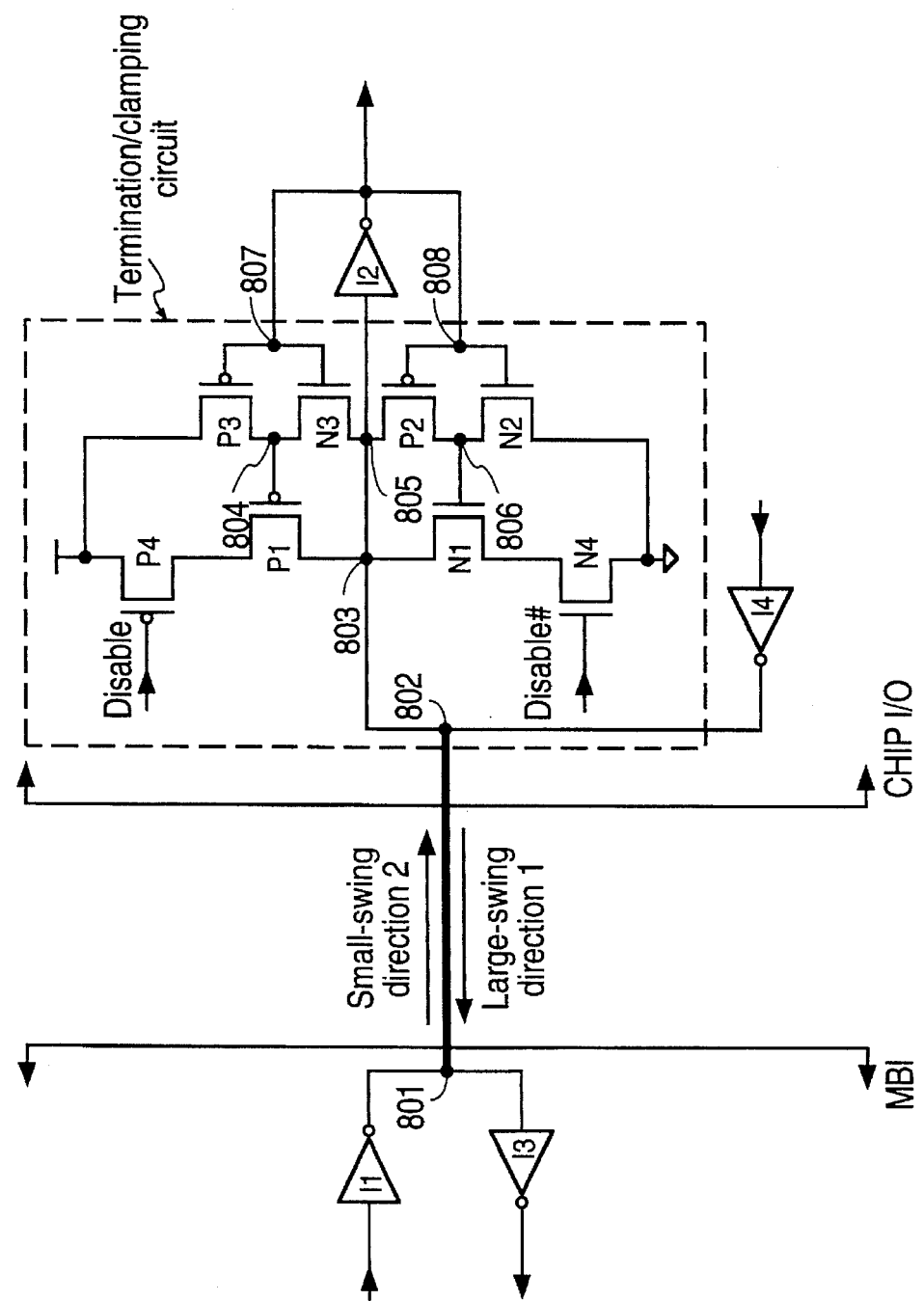
FIG. 8 shows a reduced-CMOS-swing sensing circuit with active destination-side termination.

In the present embodiment, the chip I/O drives the IMB with full CMOS swing, and the MBI drives the IMB with a reduced CMOS swing. The MBI drives the IMB with normal CMOS inverters, but the signal swing is clamped by the receiving circuitry in the chip I/O. FIG. 8 shows an embodiment of this clamping circuit (a feedback circuit, which is a variation of the clamping circuit shown in FIG. 2(a)). A negative feedback circuit (which includes the receiver inverter I2, two inverter-like N/P transistor pairs that stack on one another: transistor P3/N3 and P2/N2 and P1/N1) is used to limit the signal swing and two control transistors P4, N4 in series with transistors P1 and N1.

These transistors together with the disable and disable # signals are for disabling the feedback circuit. The swing limitation circuit is placed in the chip I/O area to limit the signal swing when one of the modules is driving the bus in the direction to the chip I/O. This is advantageous because the use of small swing signals in this direction allows the bus line drivers in the MBI to be significantly smaller compared to the case when full-swing signal is used, and resulting in significant reduction in bus capacitance contributed by the bus drivers since the memory module is replicated 18 times. This reduction in capacitance also translates to reduction in noise generation. In the other direction when the chip I/O is driving, full CMOS swing is used, the receivers in the MBI are normal CMOS inverters (without feedback circuitry); no extra silicon area is dedicated to the feedback circuit in the memory modules.

Since large signal swing requires large driver but small, simple receiver and small swing requires small driver but relatively complicated receiver (receiver with feedback circuit) by using large swing in the chip I/O to memory module direction (one driver and multiple receivers) and small swing in the module to I/O direction (multiple driver and one receiver). Area and power are minimized.

Column Address Generation

Burst mode implementation in the DRAM requires a mechanism that will allow sequentially addressed data to be accessed, given only the starting address of the sequence. Using this starting address, the memory will generates subsequent addresses which are decoded to select the appropriate column lines. An address sequencer is needed in the memory chip to sequence properly the column select lines during a burst mode.

Figure 9:
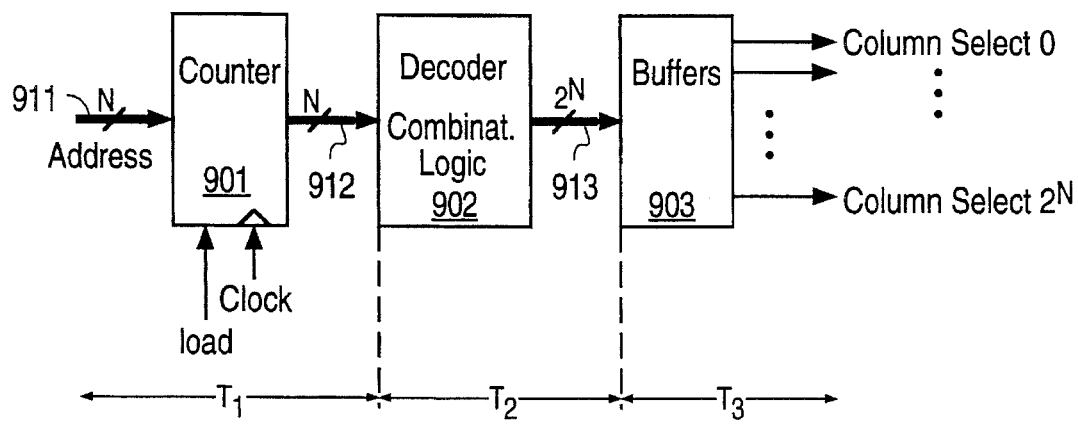
FIG. 9 shows a prior art address sequencer circuit.

FIG. 9 illustrates a prior art method to sequence the column select lines. The starting address is loaded on address bus 911 into a counter 901 controlled by the memory clock and connected to a decoder 902 by bus 912. The output of this decoder 902 on bus 913 is buffered by buffers 903 to drive the column select lines $0, \ldots, 2^N$. At every rising clock edge, the counter 901 increments and its output is decoded to generate the next active column select line. The column select lines are asserted in consecutive order for the duration of one clock cycle. One drawback to this approach is that the delay time from the clock to valid column select is the sum of the clock to out time of the counter 901, the propagation delays of the decoder 902 and the buffer 903. This delay directly affects the burst frequency and therefore access bandwidth. Because the decoder typically is implemented with combinational logic, the propagation delay through the decoder is not uniform for each output transition. As a result, simultaneous assertion of one or more column selects may occur for the duration of the decoder delay mismatches. This can cause read or write failures during high speed operations.

Figure 10A:
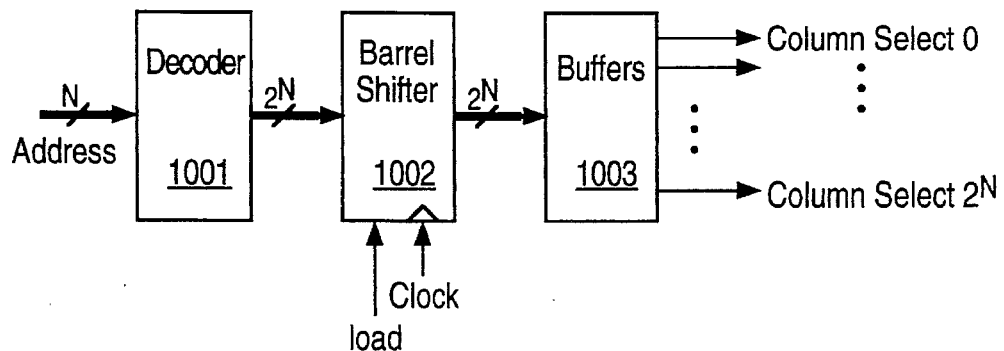
FIG. 10(a) shows an address sequencer circuit in accordance with the present invention.
Figure 10B:
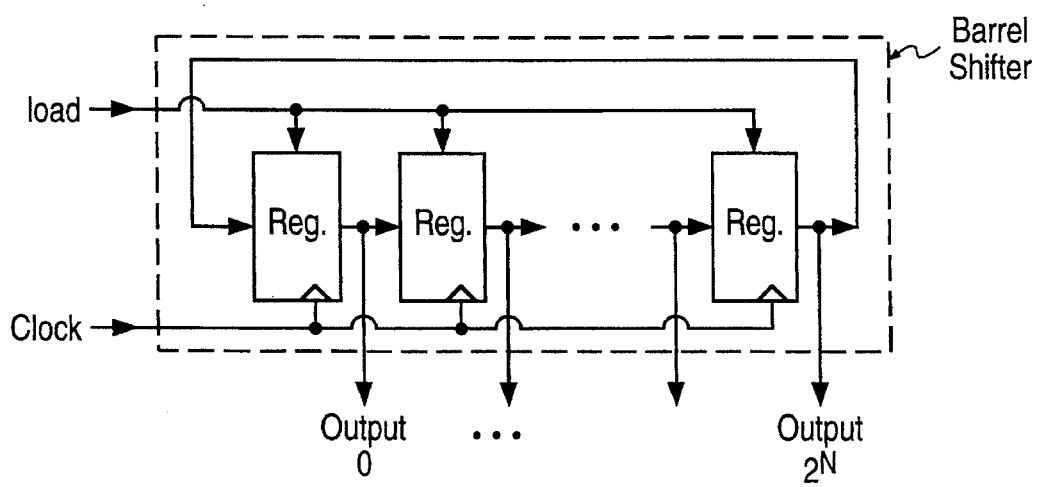
FIG. 10(b) shows a barrel shifter consisting of $2^N$ registers arranged in a ring.

One embodiment of the present invention uses another approach, shown in FIG. 10(a), which sequences the column select lines. Instead of loading the starting address into a counter, the address on the address bus is fed to a decoder 1001. The decoder 1001 decodes which column select is to be asserted. The outputs from the decoder 1001, which are all logic low except for one logic one, are loaded into a conventional barrel shifter 1002. (The barrel shifter includes registers connected in a ring configuration with the number of stages equal to the number of outputs from the decoder 1001, as shown in FIG. 10(b), which shifts the logic one to the next register at rising edges of the clock.) If the consecutive buffered outputs of the barrel shifter are connected in correspondence to consecutive column select lines $0, \ldots, 2^N$, then the column select lines will be asserted in consecutive order for the duration of one clock cycle. The functional behavior is the same as that of the prior art scheme. One advantage of the present scheme is that the delay time from the clock to valid column select is just the clock-to-out time of the latch plus the buffer delay. The decoder delay is eliminated. Secondly, as long as the decoded outputs are stable before the rising edge of the clock, the barrel shifter output will update in unison, timed to the rising edge of the clock. Since there are no combinational logic gates in the path of clock to column selects, there will be a uniform delay for clock to valid column selects. Simultaneous column select assertion is easily suppressed; therefore, this scheme minimizes read or write failures caused by address transitions.

The full address width (such as eight bits for row, five bits for column in the embodiment described) is usually divided into several subsets, each of which is represented as in FIGS. 9 and 10a, 10b to reduce the number of column select lines ($2^N$). In both the prior art and the present invention, the counter or the barrel shifter can be made to advance in incrementing or decrementing order according to certain direction-control logic (not shown).

Inter-block Burst Mode

Figure 11:
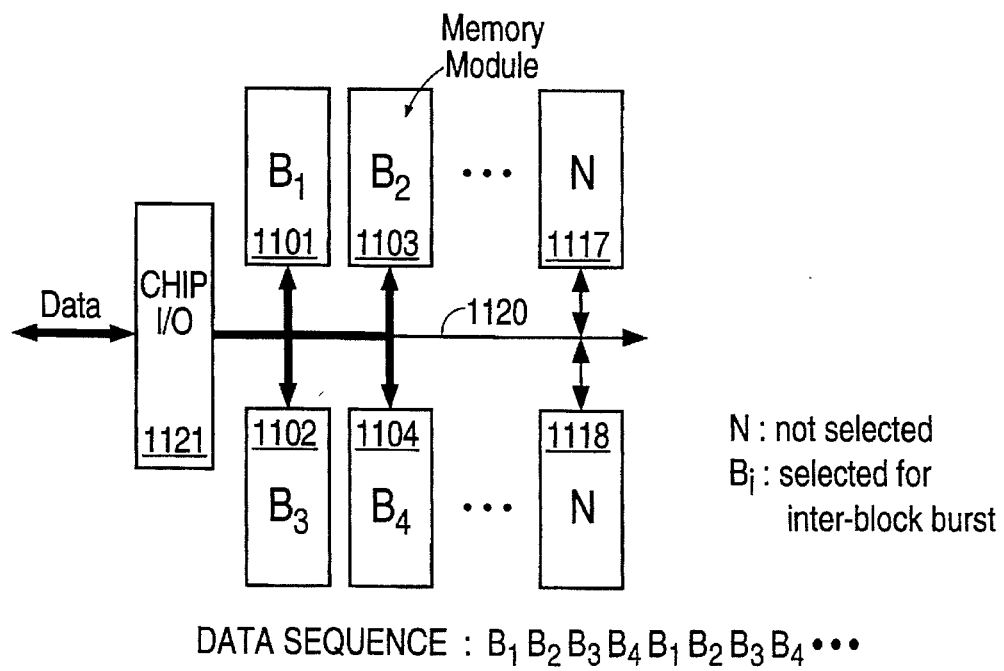
FIG. 11 shows an inter-block burst read/write operation.

With the multiple block architecture, the memory can further implement a novel inter-block burst read and write operation. Instead of bursting data in and out from the column circuitry of a particular block, multiple blocks can participate in the burst read or write operations. Basically, each participating block (through command setup to enter the inter-block mode) latches in or sends out a data word at each clock cycle consecutively as shown in FIG. 11. Memory modules 1101 to 1118 each include a mode-bit which can be set by a special command. Modules 1101 to 1104 with their mode bit set are selected for inter-block burst access operation and accessed in a repeated sequence corresponding to the present base address sequence.

In one embodiment, the bank with its ID matching all 8 bits in the ID field of the command sends first, for instance 1102, followed by 1103, 1104 and 1101 in the corresponding order. After all four banks have finished sending the first word, the CAS address in the address incrementer is increased by 1 and the sending cycle starts over again. This continues until the burst read command is terminated. Note that the burst data is not interrupted during the whole interleave access. This mode is particularly useful when the column sense amplifier caches of participating blocks are mapped into consecutive or different horizontal display lines, and thus the inter-block access represents "vertical" access to the display memory. As a result, both the horizontal access (normal column burst) and the vertical access of the display memory can be extremely fast (at burst rate).

Clock Resynchronization

Incorporating synchronous burst access capability into a DRAM operating at high frequencies increases the data access bandwidth; however, this increase in performance comes at the expense of possible increased latency for the first data accessed, increased circuit complexity and die area.

Figure 12A:
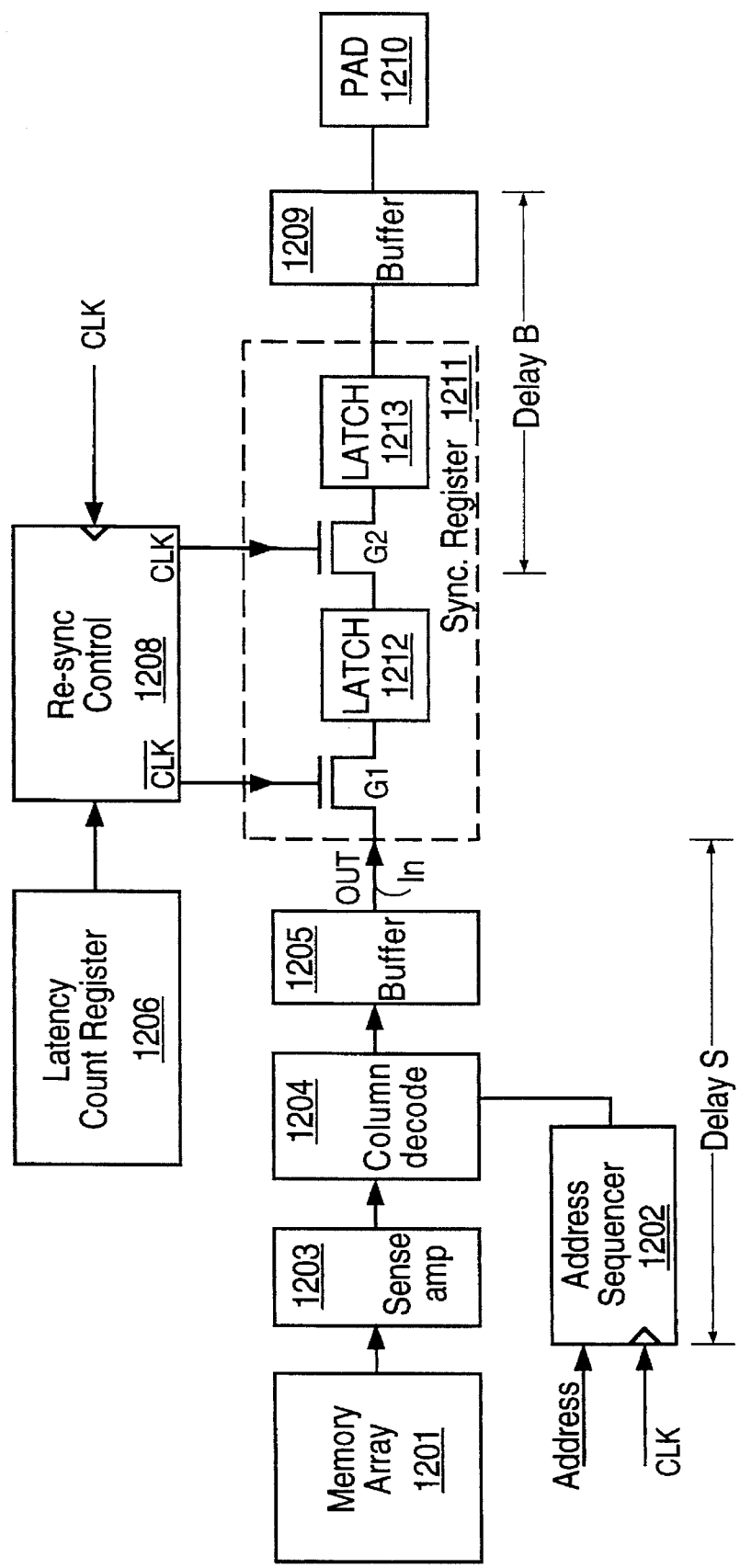
FIG. 12(a) shows a prior art resynchronization circuit.
Figure 12B:
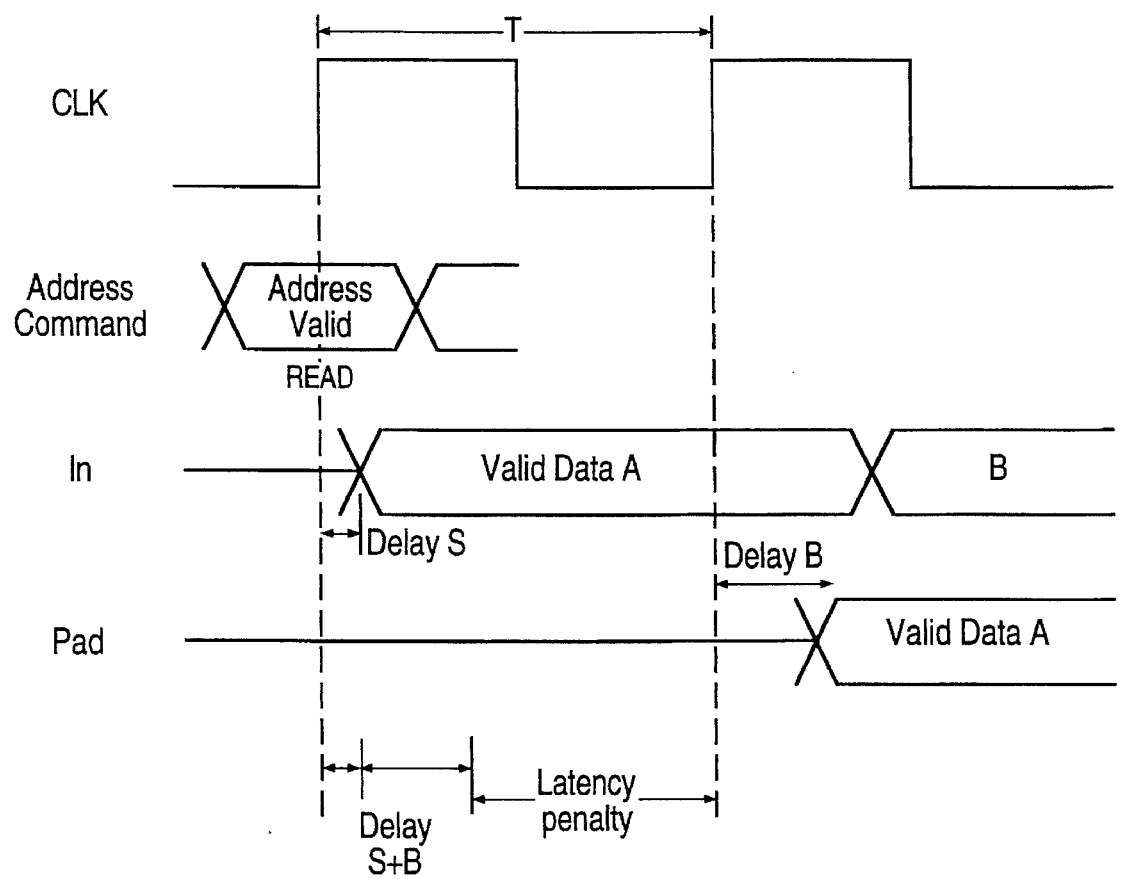
FIG. 12(b) shows a simplified timing diagram of the resynchronization circuit in FIG. 12(a).

In prior art memory designs, because of the incorporation of pipelines, implementing synchronous burst transfers normally results in increased latency for the first data accessed. In particular, the access latency is limited by the number of pipelines incorporated and is therefore quantized to clock cycles as opposed to traditional asynchronous DRAMs where access latency is measured in time. FIG. 12(a) shows an example of prior art resynchronization for the read data path. Here the input memory clock (Clk) is used to clock the pipeline stage and re-synchronize data out from the memory array. FIG. 12(b) is an associated timing diagram showing the "latency penalty" caused by synchronous burst transfer.

As shown in FIG. 12(a) and 12(b), delay S is the delay from the point the address is clocked into the address sequencer 1202 to the point the data OUT from the buffer 1205 is available at an input IN of a synchronization register 1211. Delay B is the delay from the point the gate G2 is opened by a leading edge of the clock to the point the data is available at the pad 1210. The access latency under synchronous burst transfer as shown in FIG. 12(a) is a clock cycle T. Therefore the latency penalty is the difference between a block cycle T and delay S plus delay B, as shown in FIG. 12(b).

In accordance with the present invention, an innovative method reduces the access latency penalty associated with synchronous burst operation. The DRAM thereby has the capability, at lower operating frequencies, to transmit valid data from the initialization edge.

Instead of using pipeline stages synchronized by the input memory clock (Clk) as describe above, only an address latch is used in the memory bus interface (MBI). In other words, there is no synchronization pipeline through the entire read or write access paths. For command/address or data write operation, where data are sent from the chip I/O to the memory modules, the latch in the module MBI is controlled by a buffered version of the signal Clk. Delay of the buffered clock is matched to the delay of the input data path by using similar layout and capacitive loading. The buffered clock controls the address sequencing and writing to the memory. This is one embodiment of fully-matched source synchronous data and clock path. For read access, the buffered clock is routed back to the chip I/O again fully matched to the read data path to become the Tclk (the source synchronous clock of the read path).

Figure 13:
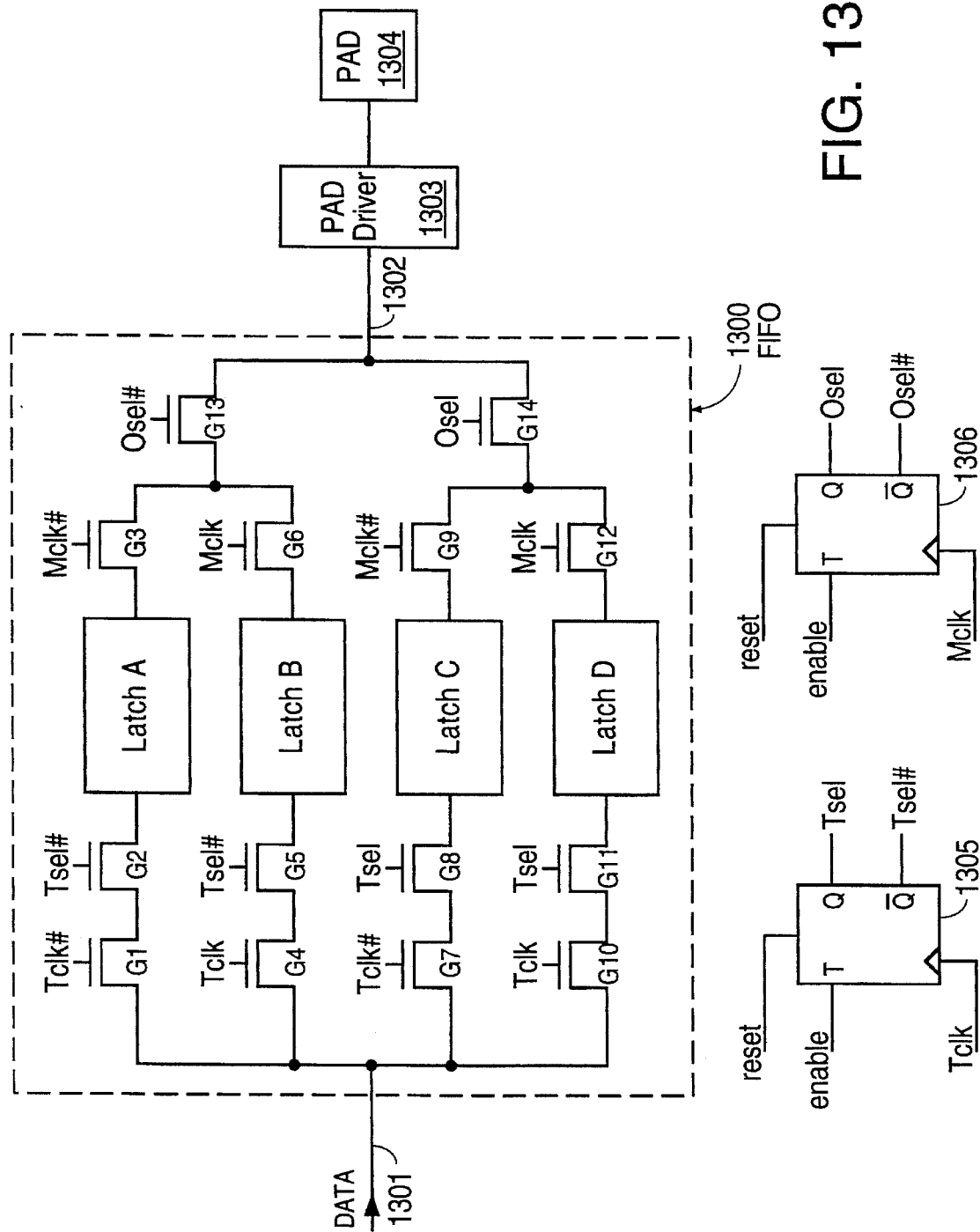
FIG. 13 shows a resynchronization circuit.

In the chip I/O area, incorporated is a FIFO memory which has an input controlled by the Tclk and an output controlled by the Clk. The FIFO is used for the re-synchronization of the data from Tclk to Clk. FIG. 13 shows the schematic of such a 4-deep FIFO 1300. The FIFO 1300 is specially designed for data input at both edges of the Tclk. Tsel and Tsel# are outputs of a toggle flip-flop 1305 which is controlled by the Tclk. Similarly, Osel and Osel# are outputs of another toggle flip-flop 1306 controlled by Mclk, which is a gated version of Clk. The reset signal is used to reset the flip-flops at the beginning of the transfer cycle. The enable lines are used to enable the state update of the flip-flops. For every Tclk edge, a piece of data is written into a latch inside the FIFO, and the write operation cycles from latches A to D.

Figure 14A:
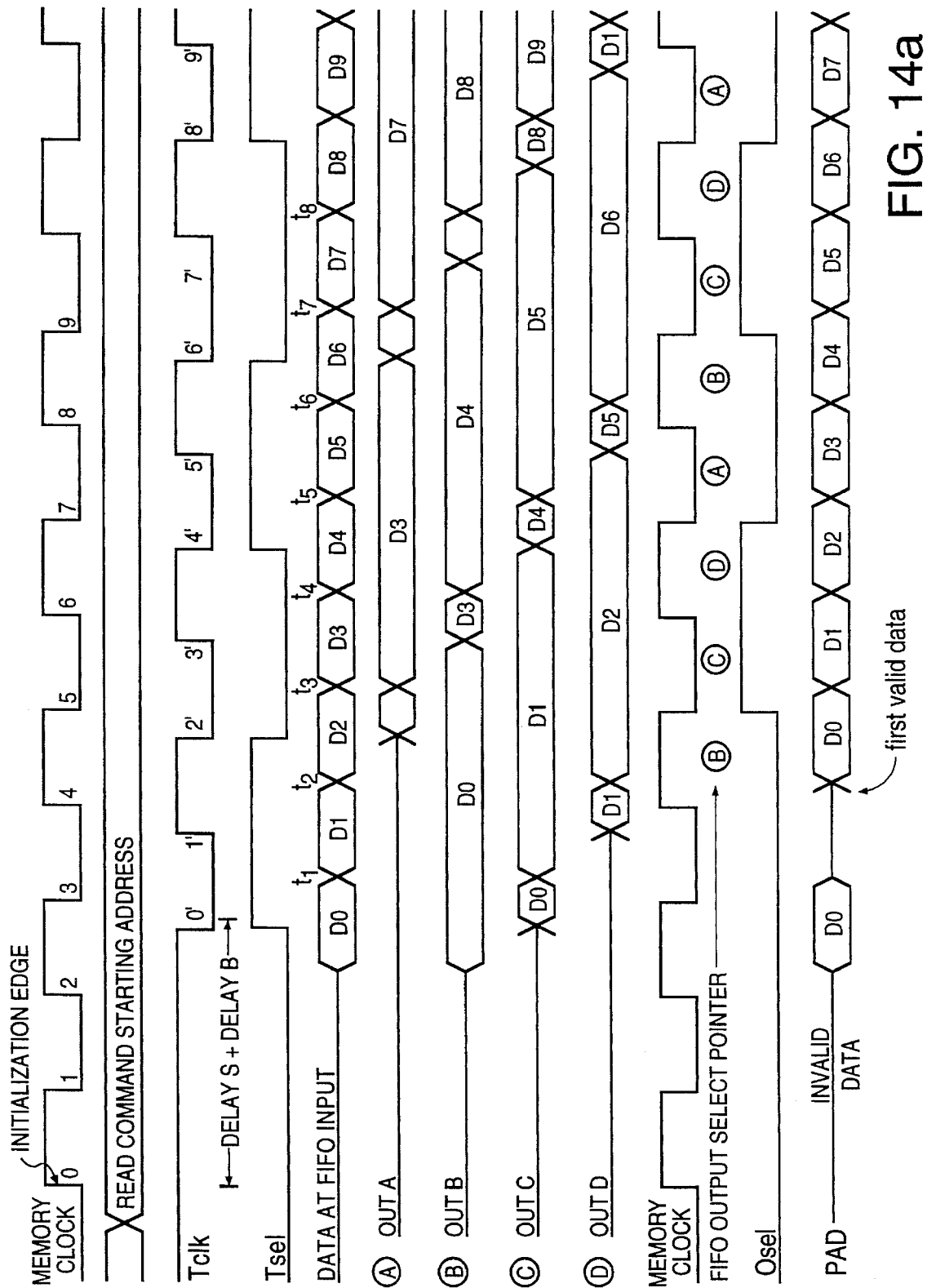
FIG. 14a and 14b show the simplified timing diagram of the circuit described in FIG. 13 with latency count (a) 4, first data out from rising edge; and (b) 3, first data out from falling edge.

FIG. 14(a) shows memory clock Mclk, source synchronous clock signal Tclk, signal Tsel, data signal at the input of FIFO, signals at the outputs of latches A to D, signal Osel and the signals at pad 1304. Edge 0 is assumed to be a initialization edge. The delay between clock signals Mclk and Tclk is delay S+B which in the shown example is less than three half-clock periods. Delay S and B have same meaning as shown in FIG. 12(a).

As seen from FIGS. 13 and 14(a), at any time only one pair of two serial transistors turn on, other pairs turn off. Specifically, before edge 0' of the signal Tclk, only transistors G4 and G5 turn on because both signals Tclk and Tsel# are high. At edge 0' transistors G4 and G45 turn off and transistors G7 and G8 turn on because signals Tclk and Tsel both transition from low to high. Data De latched into latch B is held therein until transistor pair G4 and G5 turn on again at edge 3'. Transistor G7 turns off at edge 1' because its gate signal becomes low and data D1 latched into latch C at time $t_1$ is held therein until both transistors G7 and G8 conduct again at edge 4'.

A similar situation happens to transistor pair G10 and G11 which conduct at edge 1' and turns off-at edge 2', and to transistor pair G1 and G2. The output signals of latches A to D are shown in FIG. 14(a) designating Out A to Out D. Each latch A to D holds a data for about one and half clock cycle in a definitive order. Latch B holds data $D_0, D_4, D_8, \ldots$ latch C, D1, D5, D9 ... ; latch D, D2, D6, D10 ... ; and latch A, D3, D7, D11 ....

Similarly, data is output from FIFO 1300 at each edge of Mclk. A programmable control logic (not shown) is used to control Mclk so that Mclk is turned on at a certain number Nck of half-clock periods after the memory command/ address is received. This number Nck is a measure of the total memory access delay (Tmad), the delay of Tclk from the input memory clock Mclk. In cases when Tmad is substantially smaller than half a clock period, Tclk and Mclk are very much in synchronization, Nck is set to zero and the memory operates like an asynchronous memory with no synchronization pipeline. Data flows through the FIFO's without waiting for the input or output gates (G1–G14) to open.

Figure 14B:
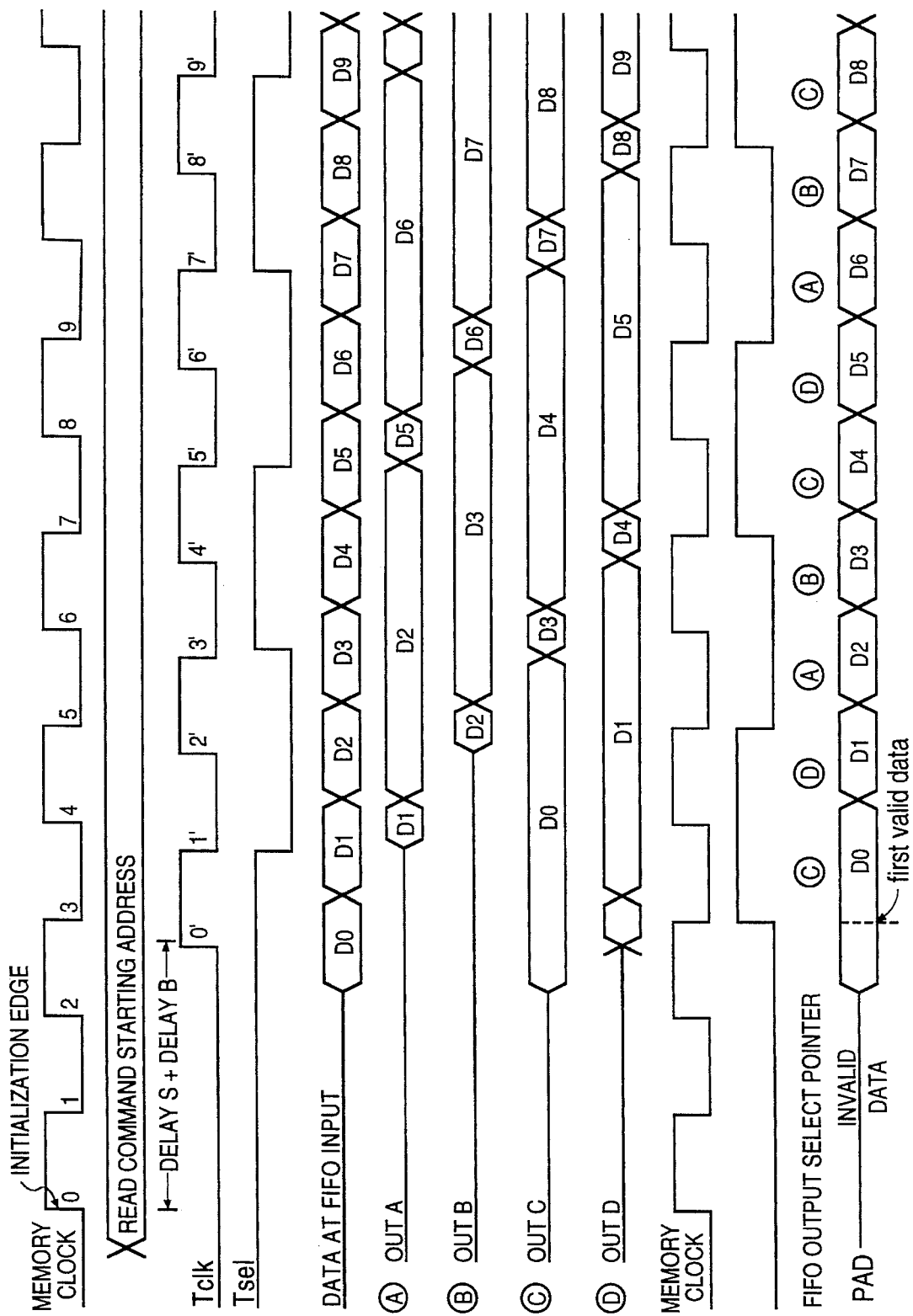

In FIG. 14(a) Nck is equal to 4 and the first data is transmitted out on the memory clock's rising edge. Examples of sampling and update sequence shown in FIG. 14(b) are similar to those shown in FIG. 14(a) except the first data is transmitted on the falling edge and the number Nck in this case is equal to 3.

Although the embodiment shown in FIG. 13 implements data transfer at both clock edges, a similar circuit can be used for re-synchronizing data with single clock edge transfers. One example is to remove the two latches controlled by Tclk# and Mclk# signals in FIG. 13 to form a two entry FIFO with data transfer at rising edge only. More entries may also be added with appropriate modification and expansion to the Tsel and Osel signals. The N-channel transfer gates shown in FIGS. 12(a) and 13 are for illustrated purpose only; those circuits may be implemented using complimentary transfer gate, P-channel gate or other logically equivalent gates.

Test Mode

Prior art memory redundancy circuit activates the "test mode" to test redundant memory sub-array (which may include redundant word-lines, redundant bit-lines, and redundant blocks) through the use of special "tri-level" voltage level on certain input pins (M. Hamada et al, "Semiconductor Memory Apparatus with a Spare Memory Cell Array", U.S. Pat. No. 5,113,371). With the present multiple block architecture, such an arrangement is not flexible.

Figure 15A:
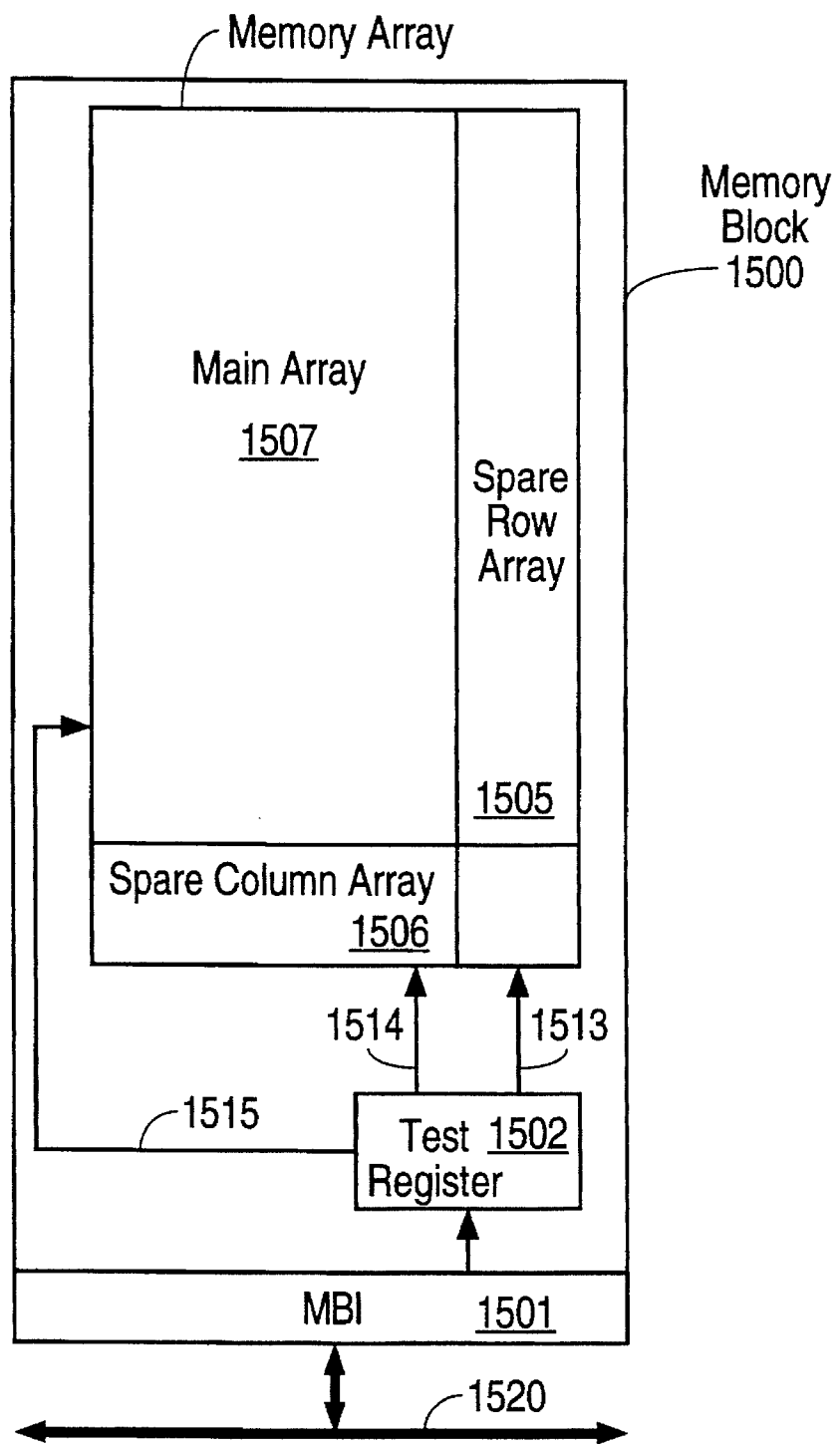
FIG. 15(a) shows a memory block with test register, and redundant sub-arrays (row and column).

Referring to FIG. 15(a), in accordance with the present invention, configuration bit or bits ("test" bit(s)) are included in each memory block 1500, so that the redundant memory sub-array(s) 1505, 1506 inside each block can be individually and independently activated and tested when the test bit(s) in test register 1502 are turned-on that enables the redundant sub-array 1505,1506 to be tested while disabling the main array 1507.

Figure 15B:
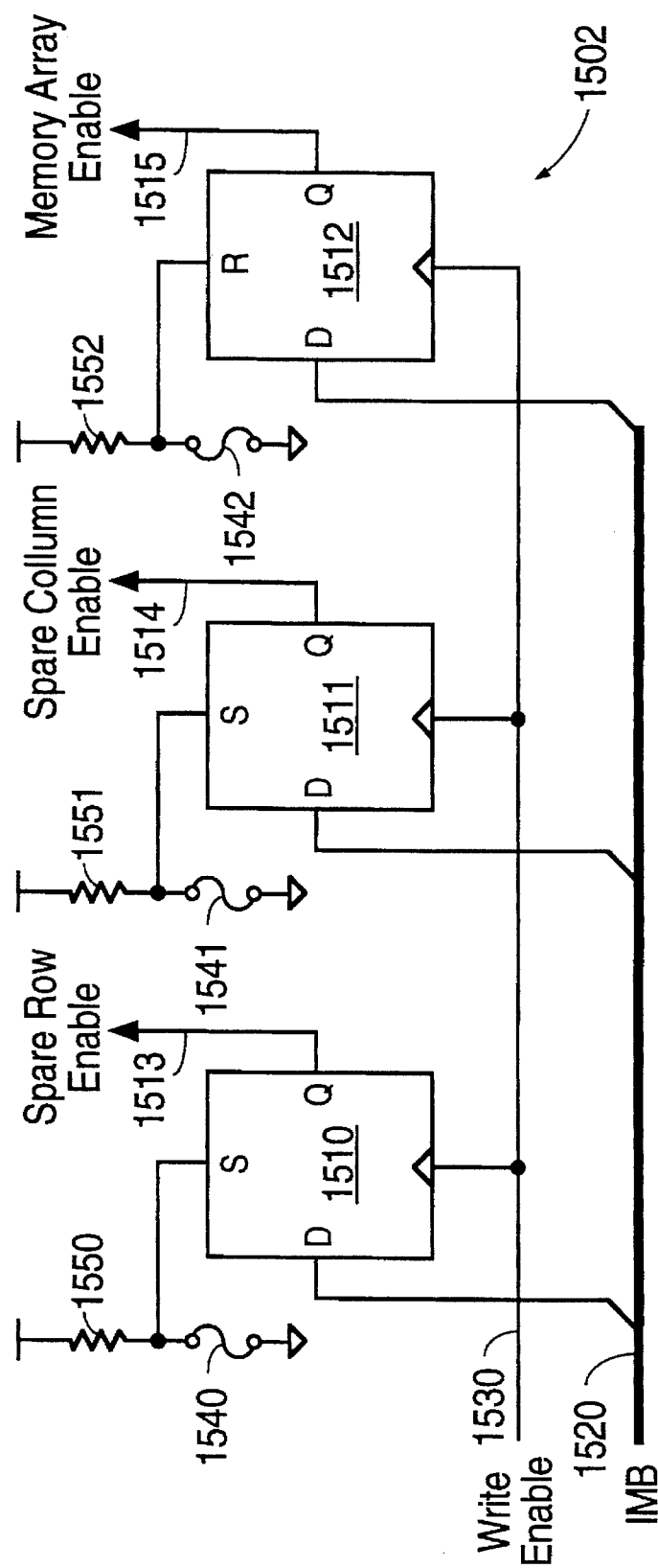
FIG. 15(b) shows a circuit diagram of the test register of FIG. 15(a).

FIG. 15(b) shows a construct of the test register 1502 of FIG. 15(a). It consists of three D type flip-flops, output of which enable the different part of memory array 1505, 1506, 1507 for access. The test register 1502 is programmable through IMB 1520 and the assertion of the write enable signal 1530. This allows for in-system memory intra-block testing and repairing. The fuses 1540, 1541 and 1542 are used to permanently enable or disable the corresponding part of the memory array.

This disclosure is illustrative and not limiting; further modifications and variations will be apparent to those skilled in the art in light of this disclosure and the appended claims.

What we claim is:

1. A circuit on a semiconductor device for limiting signal swing on a bus to a reduced CMOS-swing, said bus including a plurality of bus lines, said circuit comprising a clamping circuit for each bus line, wherein said clamping circuit comprises:
   a feedback circuit sensing a signal on said bus line and in response generating at least one feedback signal; and
   a complementary source follower responsive to said at least one feedback signal, wherein the source follower restricts said signal on said bus line and provides said reduced CMOS-swing.

2. A circuit as in claim 1, wherein said feedback circuit has a logic threshold which approximates half of a supply voltage, and said feedback signal goes low when said signal on said bus line goes above said threshold, and goes high when said signal on said bus line goes below said threshold.

3. A circuit as in claim 2, wherein said feedback circuit is a CMOS inverter.

4. A circuit as in claim 3, wherein said logic threshold is a trip point of said CMOS inverter.

5. A circuit as in claim 1, wherein said feedback circuit comprises a disable control circuit responsive to a disable signal for generating at least one signal to disable said complementary source follower.

6. A circuit as in claim 5, wherein said feedback circuit is disabled when said bus line is inactive.

7. A circuit as in claim 1, wherein said feedback circuit comprises a NAND gate.

8. A circuit as in claim 1, wherein said feedback circuit comprises a NOR gate.

9. A circuit as in claim 5 wherein said feedback circuit comprises a push-pull gate.

10. A circuit as in claim 1, wherein said clamping circuitry is located at one of a driving side and receiving side of said bus line.

11. A circuit as in claim 1, wherein said clamping circuitry is located at both driving and receiving sides of said bus lines.

12. A bus line driver circuit for limiting signal swing on a bus line to a reduced CMOS swing, comprising:
   a CMOS line driver receiving a data input signal and driving said bus line at a full CMOS swing; and
   a clamping circuit including a feedback circuit sensing a signal on said bus line driven by said CMOS line driver for generating at least one feedback signal, and a complementary source follower responsive to said at least one feedback signal and restricting said signal on said bus line to produce said reduced CMOS swing.

13. A bus line driver circuit as in claim 12, wherein said feedback circuit is a CMOS inverter.

14. A bus line driver circuit as in claim 12, wherein said CMOS line driver has an output voltage swing centered substantially to a logic threshold of said feedback circuit.

15. A bus line driver circuit as in claim 12, wherein said CMOS line driver and said clamping circuit are located at a driving side and a receiving side respectively.

16. A circuit on a semiconductor device for providing asymmetrical signal swing on a bi-directional bus in different directions, comprising:
   a first bus driver at a first bus side circuitry generating a first signal swing for data transfer over said bus in a first bus direction; and
   a second bus driver circuitry at a second bus side generating a second signal swing different from said first signal swing, for data transfer over said bus in a second bus direction.

17. A circuit as in claim 16, wherein said second swing is substantially smaller than said first signal swing.

18. A circuit as in claim 17, wherein said first signal swing is a full CMOS swing.

19. A circuit as in claim 16, wherein said first bus driver circuitry comprises a receiver circuit for each bus line, said receiver circuit comprising:
   a CMOS receiving inverter receiving a signal on said bus line and producing a feedback signal; and
   a clamping circuit receiving said feedback signal and feedback-clamping said signal on said bus line to produce said second signal swing in said second bus direction.

20. A circuit as in claim 19, wherein said clamping circuit comprises two stacked transistor pairs, each pair including a P-type and an N-type transistor in series with gates thereof connected, and a clamping stage comprising a P-type and an N-type transistor in series, an output signal of said receiving inverter being furnished to said gates of the two stacked transistor pairs, and said two stacked transistor pairs driving gates of clamping stage.

21. A circuit as in claim 20, wherein said clamping stage further comprises a disable transistor pair of a P-type and an N-type transistor in series with said P-type and N-type transistor pair of said clamping stage.

* * * * *

UNITED STATES PATENT AND TRADEMARK OFFICE
CERTIFICATE OF CORRECTION

PATENT NO.    :  5,498,990
DATED         :  March 12, 1996
INVENTOR(S)   :  Wingyu Leung, Winston Lee, and Fu-Chieh Hsu It is certified that error appears in the above-identified patent and that said Letters Patent is hereby corrected as shown below:

Column 14, line 60, delete "De" and insert --$D_o$--

Signed and Sealed this

Twenty-ninth Day of October 1996

Attest:

BRUCE LEHMAN

*Attesting Officer*    *Commissioner of Patents and Trademarks*